United States Patent
Orihara et al.

(10) Patent No.: US 9,195,131 B2
(45) Date of Patent: Nov. 24, 2015

(54) MASK BLANK GLASS SUBSTRATE, MULTILAYER REFLECTIVE FILM COATED SUBSTRATE, MASK BLANK, MASK, AND METHODS OF MANUFACTURING THE SAME

(71) Applicant: HOYA CORPORATION, Shinjuku-ku, Tokyo (JP)

(72) Inventors: Toshihiko Orihara, Shinjuku-ku (JP); Akihiro Kawahara, Shinjuku-ku (JP); Tsutomu Shoki, Shinjuku-ku (JP)

(73) Assignee: HOYA CORPORATION, Tokyo (JP)

( * ) Notice: Subject to any disclaimer, the term of this patent is extended or adjusted under 35 U.S.C. 154(b) by 219 days.

(21) Appl. No.: 13/630,622

(22) Filed: Sep. 28, 2012

(65) Prior Publication Data

US 2013/0078555 A1 Mar. 28, 2013

(30) Foreign Application Priority Data

Sep. 28, 2011 (JP) .................. 2011-212207
Aug. 1, 2012 (JP) .................. 2012-170911

(51) Int. Cl.
*G03F 1/24* (2012.01)
*G03F 1/38* (2012.01)
*G03F 1/60* (2012.01)

(52) U.S. Cl.
CPC .. *G03F 1/24* (2013.01); *G03F 1/38* (2013.01); *G03F 1/60* (2013.01)

(58) Field of Classification Search
CPC ................ G03F 1/24; G03F 1/38; G03F 1/60
USPC ............................................. 430/5
See application file for complete search history.

(56) References Cited

U.S. PATENT DOCUMENTS

| | | | |
|---|---|---|---|
| 6,352,803 B1 | 3/2002 | Tong et al. | |
| 6,387,572 B1 | 5/2002 | Tong et al. | |
| 7,129,010 B2 | 10/2006 | Alkemper et al. | |
| 7,211,354 B2 | 5/2007 | Itoh | |

FOREIGN PATENT DOCUMENTS

| | | |
|---|---|---|
| JP | 2003-501823 A | 1/2003 |
| JP | 2003-248299 A | 9/2003 |
| JP | 4401125 B2 | 1/2010 |
| WO | 2008/129914 A1 | 10/2008 |

*Primary Examiner* — Christopher Young
(74) *Attorney, Agent, or Firm* — Sughrue Mion, PLLC

(57) ABSTRACT

Provided is a mask blank glass substrate that has high surface smoothness, that is formed with a fiducial mark capable of improving the detection accuracy of a defect position or the like, and that enables reuse or recycling of a glass substrate included therein. An underlayer is formed on a main surface, on the side where a transfer pattern is to be formed, of a glass substrate for a mask blank. The underlayer serves to reduce surface roughness of the main surface of the glass substrate or to reduce defects of the main surface of the glass substrate. A surface of the underlayer is a precision-polished surface. A fiducial mark which provides a reference for a defect position in defect information is formed on the underlayer.

16 Claims, 5 Drawing Sheets

MASK BLANK GLASS SUBSTRATE, MULTILAYER REFLECTIVE FILM COATED SUBSTRATE, MASK BLANK, MASK, AND METHODS OF MANUFACTURING THE SAME

This application is based upon and claims the benefit of priority from Japanese patent application No. 2011-212207, filed on Sep. 28, 2011, and Japanese patent application No. 2012-170911, filed on Aug. 1, 2012, the disclosures of which are incorporated herein in their entirety by reference.

TECHNICAL FIELD

This invention relates to a mask blank glass substrate, a multilayer reflective film coated substrate, a mask blank, and a mask which are adapted for use in the manufacture of semiconductor devices or the like, and further relates to methods of manufacturing the same.

BACKGROUND ART

Generally, fine pattern formation is carried out by the photolithography in the manufacture of a semiconductor device. A number of transfer masks called photomasks are normally used for such fine pattern formation. The transfer mask comprises generally a transparent glass substrate having thereon a fine pattern made of a metal thin film or the like. The photolithography is used also in the manufacture of the transfer mask.

In the manufacture of a transfer mask by the photolithography, use is made of a mask blank having a thin film (e.g. a light-shielding film (an opaque film)) for forming a transfer pattern (mask pattern) on a transparent substrate such as a glass substrate. The manufacture of the transfer mask using the mask blank comprises a writing process of writing a required pattern on a resist film formed on the mask blank, a developing process of, after the writing, developing the resist film to form a resist pattern, an etching process of etching the thin film using the resist pattern as a mask, and a process of stripping and removing the remaining resist pattern. In the developing process, a developer is supplied after writing the required pattern on the resist film formed on the mask blank to dissolve a portion of the resist film soluble in the developer, thereby forming the resist pattern. In the etching process, using the resist pattern as a mask, an exposed portion of the thin film, where the resist pattern is not formed, is removed by dry etching or wet etching, thereby forming a required mask pattern on the transparent substrate. In this manner, the transfer mask is produced.

As a type of transfer mask, a phase shift mask is known apart from a conventional binary mask having a light-shielding film pattern made of a chromium-based material on a transparent substrate. The phase shift mask is configured to have a phase shift film on a transparent substrate. The phase shift film is adapted to provide a predetermined phase difference and is made of, for example, a material containing a molybdenum silicide compound. Further, use has also been made of a binary mask using, as a light-shielding film, a material containing a metal silicide compound such as a molybdenum silicide compound.

In recent years, with higher integration of semiconductor devices, patterns finer than the transfer limit of the photolithography using the conventional ultraviolet light have been required in the semiconductor industry. In order to enable formation of such fine patterns, the EUV lithography being an exposure technique using extreme ultraviolet (hereinafter referred to as "EUV") light is expected to be promising. Herein, the EUV light represents light in a wavelength band of the soft X-ray region or the vacuum ultraviolet region and, specifically, light having a wavelength of about 0.2 nm to 100 nm. As a mask for use in the EUV lithography, there has been proposed a reflective mask in which a multilayer reflective film for reflecting exposure light is formed on a substrate and an absorber film for absorbing exposure light is formed in a pattern on the multilayer reflective film.

With the increasing demand for miniaturization in the lithography process as described above, problems in the lithography process are becoming remarkable. One of them is a problem about defect information of a substrate for a mask blank for use in the lithography process.

Conventionally, taking the center of a substrate as the origin (0,0), the existing position of a defect of the substrate is specified by the distance from the origin (0,0) in a mask blank inspection or the like. As a consequence, the position accuracy is low and thus, when patterning a thin film for pattern formation (hereinafter referred to as a "pattern-formation thin film") while avoiding the defect at the time of pattern writing, it is difficult to avoid it on the order of micrometers. Therefore, the defect is avoided by changing the direction of pattern transfer or roughly shifting the pattern transfer position on the order of millimeters.

Under these circumstances, for the purpose of enhancing the inspection accuracy of a defect position, there have been several proposals, for example, to form a fiducial mark on a substrate for a mask blank and to specify a position of a defect using the fiducial mark as a reference position.

WO2008/129914 (Patent Document 1) discloses that, in order to accurately specify a position of a minute defect having a sphere-equivalent diameter of about 30 nm, at least three marks having a sphere-equivalent diameter of 30 nm to 100 nm are formed on a film-forming surface of a substrate for a reflective mask blank for EUV lithography. On the other hand, JP-A-2003-248299 (Patent Document 2) discloses that a fiducial mark in the form of pits is provided on a surface of a transparent substrate.

SUMMARY OF THE INVENTION

It is possible to enhance the inspection accuracy of a defect position of a mask blank by the method disclosed in Patent Document 1 or 2. However, according to such a conventional method, a fiducial mark is formed by digging down a substrate (generally a glass substrate) for a mask blank and, therefore, for example, in the case of a mask blank whose surface defect is found after forming a pattern-formation thin film on the substrate or in the case of a transfer mask which is produced using a mask blank and in which a pattern defect that is difficult to correct is found, it is difficult to reuse or recycle the substrate by stripping and removing the thin film from the substrate without discarding the mask blank or the transfer mask as a defective. In recent years, price competition for electronic components such as semiconductor devices has intensified more and more and thus it has become important to suppress the manufacturing cost of transfer masks. In this connection, reuse or recycling of substrates has become important. Further, in recent years, with the miniaturization of patterns in semiconductor devices or the like, high-precision and high-quality transfer masks have been required and thus, in mask blanks for manufacturing such transfer masks, high-value-added expensive substrates have often been used. Accordingly, also in this connection, in order to suppress the manufacturing cost of the transfer masks, it has become important to recycle the substrates.

As the substrate for the EUV reflective mask, a material having a low thermal expansion coefficient, such as a $SiO_2$—$TiO_2$-based glass, is used in order to prevent distortion of a pattern due to heat in exposure. With such a glass material, it is difficult to achieve high smoothness such as a surface roughness of 0.1 nm or less in RMS (root mean square roughness) by precision polishing. As a consequence, if a fiducial mark is formed directly on the surface of the substrate made of such a glass material, there arises a problem that when a highly sensitive defect inspection apparatus is used, background noise due to the surface roughness becomes large, resulting in an increase in false defect detection.

This invention has been made in view of the above-mentioned conventional problems and it is an object of this invention to provide a mask blank glass substrate and a multilayer reflective film coated substrate that can each suppress false defect detection in a highly sensitive defect inspection apparatus to thereby enhance the detection accuracy of a defect position or the like using a fiducial mark as a reference and that each enable recycling of a glass substrate included therein, and further to provide methods of manufacturing them.

It is another object of this invention to provide a mask blank and a mask each using such a mask blank glass substrate or such a multilayer reflective film coated substrate and further to provide methods of manufacturing such a mask blank and such a mask.

As a result of intensive studies to achieve the above-mentioned objects, the present inventor has found out that if an underlayer is formed on a main surface of a glass substrate on which a transfer pattern is to be formed, so as to reduce surface roughness of the main surface of the glass substrate or to reduce defects of the main surface of the glass substrate, and if a fiducial mark which provides a reference for a defect position in defect information is formed on this underlayer, it is possible to suppress false defect detection and thus to enhance the detection accuracy of a defect position or the like regardless of the glass composition of the glass substrate. The present inventor has also found that, by forming the fiducial mark on such an underlayer, it is possible to recycle the glass substrate afterwards.

As a result of further intensive studies based on the elucidated fact described above, the present inventor has completed this invention.

Specifically, in order to achieve the above-mentioned objects, this invention has the following structures.

(Structure 1)

A mask blank glass substrate, comprising a glass substrate having a main surface on which a transfer pattern is to be formed, an underlayer that is formed on the main surface to reduce a surface roughness of the main surface of the glass substrate or to reduce defects of the main surface of the glass substrate and that has a precision-polished surface, and a fiducial mark formed on the underlayer to provide a reference for a defect position in defect information.

As recited in Structure 1, on the main surface, on the side where the transfer pattern is to be formed, of the glass substrate, the underlayer serving to reduce the surface roughness of the main surface of the glass substrate or to reduce the defects of the main surface of the glass substrate is formed, and the surface of the underlayer is the precision-polished surface. In other words, a surface of the underlayer has an underlayer surface roughness smaller than a main surface roughness of the main surface of the glass substrate. Therefore, the surface of the underlayer has high smoothness. Since the fiducial mark which provides the reference for the defect position in the defect information is formed on this underlayer having the high surface smoothness, it is possible to reduce background noise due to the surface roughness and thus to suppress false defect detection in a highly sensitive defect inspection apparatus and, as a result, it is possible to improve the detection accuracy of a defect position or the like using the fiducial mark as the reference. Further, since the fiducial mark is formed on the underlayer, in the case of a mask blank whose surface defect is found after forming a pattern-formation thin film on the underlayer or in the case of a transfer mask which is produced using a mask blank and in which a pattern defect that is difficult to correct is found, it is possible to recycle the glass substrate by stripping and removing the thin film and the underlayer from the glass substrate without discarding the mask blank or the transfer mask as a defective.

(Structure 2)

The mask blank glass substrate according to Structure 1, wherein the underlayer is made of Si or a silicon compound containing Si.

As recited in Structure 2, since the material of the underlayer is Si or the silicon compound containing Si, the underlayer has translucency for KrF excimer laser light (wavelength: 248 nm) or ArF excimer laser light (wavelength: 193 nm). Therefore, the mask blank glass substrate according to Structure 2 is suitable as a glass substrate for a mask to which such laser light is applied as exposure light. Further, if a surface of a thin film made of Si or a silicon compound containing Si is precision-polished with a polishing liquid containing abrasive particles such as colloidal silica, extremely high smoothness can be obtained relatively easily. Accordingly, Structure 2 is preferable also in this respect.

(Structure 3)

The mask blank glass substrate according to Structure 1, wherein the underlayer is made of a material that is etchable by the use of a chlorine-based gas.

(Structure 4)

The mask blank glass substrate according to Structure 3, wherein the underlayer is made of Al, Ta, Zr, Ti, Cr, or a material containing at least one of them.

As recited in Structure 3, when the underlayer is made of the material that can be removed by etching with the chlorine-based gas which gives little damage to the glass substrate, the underlayer can be stripped and removed from the glass substrate without giving damage to the glass substrate, which is thus preferable for recycling of the glass substrate.

As the material that can be removed by etching with the chlorine-based gas, it is preferable to use, for example, Al, Ta, Zr, Ti, Cr, or the material containing at least one of them as recited in Structure 4.

(Structure 5)

The mask blank glass substrate according to any one of Structures 1 to 4, wherein the glass substrate is made of a $SiO_2$—$TiO_2$-based glass or a multicomponent glass-ceramic.

As recited in Structure 5, in the case where the glass substrate is made of the $SiO_2$—$TiO_2$-based glass or the multicomponent glass-ceramic, high surface smoothness of the mask blank glass substrate is obtained when the underlayer serving to reduce the glass substrate surface roughness or to reduce the glass substrate surface defects is formed on the main surface of the glass substrate.

(Structure 6)

A multilayer reflective film coated substrate, wherein a multilayer reflective film adapted to reflect EUV light is formed on the underlayer of the mask blank glass substrate according to any one of Structures 1 to 5.

Since the multilayer reflective film adapted to reflect the EUV light is formed on the underlayer of the mask blank glass substrate having the above-mentioned structure, there is obtained the multilayer reflective film coated substrate that is formed with the fiducial mark, that has high surface smoothness, and that enables recycling of the glass substrate.

That is, since the multilayer reflective film is formed on the underlayer serving to reduce the glass substrate surface roughness or to reduce the glass substrate surface defects and having high surface smoothness, a surface of the multilayer reflective film can also obtain high smoothness. Therefore, there is obtained the multilayer reflective film coated substrate that can suppress false defect detection in a defect inspection of the surface of the multilayer reflective film to thereby enhance the detection accuracy of a defect position or the like using the fiducial mark as the reference.

(Structure 7)

A mask blank, wherein a thin film to be a transfer pattern is formed on the underlayer of the mask blank glass substrate according to any one of Structures 1 to 5 or on the multilayer reflective film of the multilayer reflective film coated substrate according to Structure 6.

Since the thin film to be the transfer pattern is formed on the underlayer of the mask blank glass substrate having the above-mentioned structure or on the multilayer reflective film of the multilayer reflective film coated substrate having the above-mentioned structure, there is obtained the mask blank that is formed with the fiducial mark, that has high surface smoothness, and that enables recycling of the glass substrate.

That is, since the thin film to be the transfer pattern is formed on the underlayer serving to reduce the glass substrate surface roughness or to reduce the glass substrate surface defects and having high surface smoothness (on the multilayer reflective film in the case of the multilayer reflective film coated substrate of Structure 6), a surface of the thin film to be the transfer pattern can also obtain high smoothness. Therefore, there is obtained the mask blank that can suppress false defect detection in a defect inspection of the surface of the thin film to be the transfer pattern to thereby enhance the detection accuracy of a defect position or the like using the fiducial mark as the reference.

(Structure 8)

A mask, wherein the thin film of the mask blank according to Structure 7 is patterned.

When a pattern defect that is difficult to correct is found, the mask of Structure 8 enables recycling of the glass substrate by stripping and removing the thin film and the underlayer from the glass substrate (including the multilayer reflective film in the case of the multilayer reflective film coated substrate of Structure 6).

(Structure 9)

A method of manufacturing a mask blank glass substrate, comprising:

a surface machining step of carrying out surface machining so that a main surface of a glass substrate has a predetermined flatness;

an underlayer forming step of forming an underlayer on the main surface of the glass substrate, the underlayer serving to reduce surface roughness of the main surface of the glass substrate or to reduce defects of the main surface of the glass substrate;

a precision polishing step of carrying out precision polishing so that a surface of the underlayer has a predetermined surface roughness; and a fiducial mark forming step of forming a fiducial mark on the underlayer, the fiducial mark providing a reference for a defect position in defect information.

According to the mask blank glass substrate manufacturing method of Structure 9, on the main surface, on the side where a transfer pattern is to be formed, of the glass substrate, it is possible to form the underlayer serving to reduce the surface roughness of the main surface of the glass substrate or to reduce the defects of the main surface of the glass substrate and having high surface smoothness, and the fiducial mark which provides the reference for the defect position in the defect information is formed on this underlayer. Therefore, it is possible to reduce background noise due to the surface roughness and thus to suppress false defect detection in a highly sensitive defect inspection apparatus and, as a result, it is possible to improve the detection accuracy of a defect position or the like using the fiducial mark as the reference. Further, since the fiducial mark is formed on the underlayer, in the case of a mask blank whose surface defect is found after forming a pattern-formation thin film on the underlayer or in the case of a transfer mask which is produced using a mask blank and in which a pattern defect that is difficult to correct is found, it is possible to recycle the glass substrate by stripping and removing the thin film and the underlayer from the glass substrate without discarding the mask blank or the transfer mask as a defective.

(Structure 10)

The method according to Structure 9, wherein the fiducial mark forming step is carried out after the precision polishing step.

As recited in Structure 10, it is preferable to carry out the fiducial mark forming step after the precision polishing step in terms of the control of the shape of the fiducial mark and the suppression of defect occurrence. That is, since the fiducial mark forming step is carried out after the precision polishing step, there is no possibility of degradation of the cross-sectional shape of the fiducial mark. Therefore, there is no possibility of a reduction in contrast by detection light when detecting the fiducial mark. After the precision polishing step, a cleaning step is normally carried out for the purpose of removing abrasive particles used in the precision polishing step. Since the cleaning step is carried out before the fiducial mark forming step, the surface, where the fiducial mark is to be formed, of the underlayer is smooth and thus it is possible to prevent the occurrence of a new defect due to residue of the abrasive particles.

(Structure 11)

The method according to Structure 10, further comprising a defect inspection step of carrying out a defect inspection of the underlayer between the precision polishing step and the fiducial mark forming step.

(Structure 12)

The method according to Structure 11, wherein measurement data of the defect inspection includes the size and number of defects and, as a result of the defect inspection, the glass substrate with the underlayer judged to be successful is subjected to the fiducial mark forming step while the glass substrate with the underlayer judged to be unsuccessful is subjected to defect correction, repolishing of the surface of the underlayer, or recycling of the glass substrate by stripping the underlayer.

By providing the defect inspection step of carrying out the defect inspection of the underlayer between the precision polishing step and the fiducial mark forming step as recited in Structure 11, it is possible to carry out, for example, as recited in Structure 12, the defect correction, the repolishing of the surface of the underlayer, or the recycling of the glass substrate by stripping the underlayer for the glass substrate with the underlayer judged to be unsuccessful as a result of the defect inspection before forming the fiducial mark.

(Structure 13)

A method of manufacturing a multilayer reflective film coated substrate, comprising a multilayer reflective film forming step of forming a multilayer reflective film, adapted to reflect EUV light, on the underlayer of the mask blank glass substrate obtained by the method according to any one of Structures 9 to 12.

By forming the multilayer reflective film adapted to reflect the EUV light on the surface of the underlayer of the mask blank glass substrate having the above-mentioned structure, there is obtained the multilayer reflective film coated substrate that is formed with the fiducial mark, that has high surface smoothness, and that enables recycling of the glass substrate.

That is, since the multilayer reflective film is formed on the underlayer serving to reduce the glass substrate surface roughness or to reduce the glass substrate surface defects and having high surface smoothness, a surface of the multilayer reflective film can also obtain high smoothness. Therefore, there is obtained the multilayer reflective film coated substrate that can suppress false defect detection in a defect inspection of the surface of the multilayer reflective film to thereby enhance the detection accuracy of a defect position or the like using the fiducial mark as the reference.

(Structure 14)

A method of manufacturing a mask blank, comprising a transfer-pattern-formation thin film forming step of forming a thin film to be a transfer pattern on the underlayer of the mask blank glass substrate obtained by the method according to any one of Structures 9 to 12 or on the multilayer reflective film of the multilayer reflective film coated substrate obtained by the method according to Structure 13.

By forming the thin film to be the transfer pattern on the underlayer of the mask blank glass substrate having the above-mentioned structure or on the multilayer reflective film of the multilayer reflective film coated substrate having the above-mentioned structure, there is obtained the mask blank that is formed with the fiducial mark, that has high surface smoothness, and that enables recycling of the glass substrate.

That is, since the thin film to be the transfer pattern is formed on the underlayer serving to reduce the glass substrate surface roughness or to reduce the glass substrate surface defects and having high surface smoothness (on the multilayer reflective film in the case of the multilayer reflective film coated substrate obtained by Structure 13), a surface of the thin film to be the transfer pattern can also obtain high smoothness. Therefore, there is obtained the mask blank that can suppress false defect detection in a defect inspection of the surface of the thin film to be the transfer pattern to thereby enhance the detection accuracy of a defect position or the like using the fiducial mark as the reference.

(Structure 15)

A method of manufacturing a mask, comprising patterning the thin film of the mask blank obtained by the method according to Structure 14.

When a pattern defect that is difficult to correct is found, the mask obtained by Structure 15 enables recycling of the glass substrate by stripping and removing the thin film and the underlayer from the glass substrate (including the multilayer reflective film in the case of the multilayer reflective film coated substrate obtained by Structure 13).

(Structure 16)

A mask manufacturing method comprising carrying out a defect inspection of the multilayer reflective film coated substrate obtained by the method according to claim 13 by using as the reference the fiducial mark formed on the underlayer, and manufacturing a mask based on a result of the defect inspection.

The mask manufacturing method according to Structure 16 makes it possible to obtain a defect free mask by manufacturing masks through the step of collating the result of the defect inspection with predetermined drawing data (mask pattern data) previously designed on the basis of a fiducial mark and the step of correcting the drawing data so that an adverse influence due to the defect can be reduced. Moreover, when the mask obtained in the above-mentioned manner is set onto an exposure apparatus and is used to perform pattern transcription onto a resist film formed on a semiconductor substrate, it is possible to realize outstanding pattern transcription without any pattern defect resulting from any defect of the mask.

(Structure 17)

A mask blank substrate comprising a substrate that has a main surface with a main surface roughness, an underlayer that is contacted with the main surface and that has an underlayer surface roughness smaller than the main surface roughness, and a fiducial mark located on the underlayer to provide a reference for a defect position in defect information.

(Structure 18)

A multilayer reflective film coated substrate, wherein a multilayer reflective film that reflects EUV light and that is contacted with the surface of the underlayer of the mask blank substrate according to Structure 17.

(Structure 19)

A mask blank comprising a thin film for forming a transfer pattern, that is located on the underlayer of the mask blank substrate according to Structure 17 or that is located on the multilayer reflective film of the multilayer reflective film coated substrate according to Structure 18.

(Structure 20)

A mask comprising a transfer pattern that is located on the underlayer of the mask blank substrate according to Structure 17 or that is located on the multilayer reflective film of the multilayer reflective film coated substrate according to Structure 18.

According to this invention, it is possible to provide a mask blank glass substrate and a multilayer reflective film coated substrate having a multilayer reflective film on the mask blank glass substrate that can each suppress false defect detection in a highly sensitive defect inspection apparatus to thereby enhance the detection accuracy of a defect position or the like using a fiducial mark as a reference and that each enable recycling of a glass substrate included therein, and further to provide methods of manufacturing them.

Further, according to this invention, it is possible to provide a mask blank and a mask each using such a mask blank glass substrate or such a multilayer reflective film coated substrate, thus, each capable of suppressing false defect detection in a highly sensitive defect inspection apparatus to thereby enhance the detection accuracy of a defect position or the like using a fiducial mark as a reference and each enabling recycling of a glass substrate included therein, and further to provide methods of manufacturing such a mask blank and such a mask.

DESCRIPTION OF THE EMBODIMENTS

Hereinbelow, embodiments of this invention will be described in detail.

[Mask Blank Glass Substrate]

First, a mask blank glass substrate according to this invention will be described.

The mask blank glass substrate according to this invention is such that an underlayer is formed on a main surface, on the side where a transfer pattern is to be formed, of a glass substrate, the underlayer serving to reduce surface roughness of the main surface of the glass substrate or to reduce defects of the main surface of the glass substrate, a surface of the underlayer is a precision-polished surface, and a fiducial mark which provides a reference for a defect position in defect information is formed on the underlayer.

Figure 3:
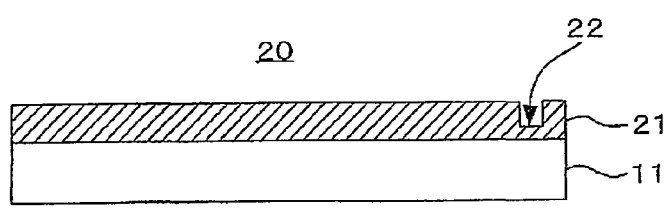
FIG. 3 is a cross-sectional view of a mask blank glass substrate according to an embodiment of this invention.

FIG. 3 is a cross-sectional view of a mask blank glass substrate according to an embodiment of this invention.

In FIG. 3, a mask blank glass substrate 20 comprises a glass substrate 11 and an underlayer 21 formed on a main surface, on the side where a transfer pattern is to be formed, of the glass substrate 11. A fiducial mark 22 in the form of a recess is formed on the underlayer 21 such that the fiducial mark 22 does not reach the glass substrate 11.

By forming a thin film to be a transfer pattern on a surface of the underlayer 21 of the mask blank glass substrate 20, a mask blank for exposure is obtained. Specifically, the mask blank may be a binary mask blank having a light-shielding film on the surface of the underlayer 21, a phase shift mask blank having a phase shift film or a phase shift film and a light-shielding film on the surface of the underlayer 21, or the like. As exposure light, KrF excimer laser light or ArF excimer laser light may be used, for example.

On the other hand, by forming a multilayer reflective film adapted to reflect EUV light on the surface of the underlayer 21 of the mask blank glass substrate 20, a multilayer reflective film coated substrate is obtained. If an absorber layer adapted to absorb the EUV light is formed as a thin film to be a transfer pattern on this multilayer reflective film, a reflective mask blank for EUV exposure is obtained.

When the glass substrate 11 is used for the binary mask blank or the phase shift mask blank, there is no particular limitation as long as it has transparency at an exposure wavelength to be used and use may be made of, for example, a synthetic quartz substrate or one of various other glass substrates such as a soda-lime glass substrate or an aluminosilicate glass substrate. Among them, the synthetic quartz substrate is particularly preferable because it has high transparency at the wavelength of ArF excimer laser light or in a shorter wavelength region.

In the case of the reflective mask blank for EUV exposure, in order to prevent distortion of a pattern due to heat in exposure, use is preferably made of, as the glass substrate 11, a material having a low thermal expansion coefficient in a range of $0\pm1.0\times10^{-7}/°$ C., more preferably in a range of $0\pm0.3\times10^{-7}/°$ C. As the material having the low thermal expansion coefficient in this range, it is possible to use, for example, a $SiO_2$—$TiO_2$-based glass or a multicomponent glass-ceramic.

The main surface, on the side where the transfer pattern is to be formed, of the glass substrate 11 is machined to have high flatness in terms of ensuring at least high pattern transfer accuracy and high pattern position accuracy. The surface machining process will be described later. For example, in the case of the mask blank for KrF excimer laser exposure or ArF excimer laser exposure, the flatness is preferably 0.3 μm or less and particularly preferably 0.1 μm or less in a 142 mm×142 mm region of the main surface, on the side where the transfer pattern is to be formed, of the glass substrate 11.

In the case of the reflective mask blank for EUV exposure, the flatness is preferably 0.1 μm or less and particularly preferably 0.05 μm or less in a 142 mm×142 mm region of the main surface, on the side where the transfer pattern is to be formed, of the glass substrate 11. A main surface, on the side opposite to the side where the transfer pattern is to be formed, of the glass substrate 11 is a surface which is electrostatically chucked when the mask blank is set in an exposure apparatus. The flatness of this main surface is 1 μm or less, preferably 0.5 μm or less in a 142 mm×142 mm region.

In this invention, the surface roughness required as a glass substrate for a mask blank is finally adjusted by the surface roughness of the surface of the underlayer 21, but, in consideration of the influence on the surface of the underlayer 21, the surface roughness of the main surface, on the side where the transfer pattern is to be formed, of the glass substrate 11 is preferably 0.3 nm or less in RMS.

The underlayer 21 is formed for the purpose of reducing the surface roughness of the main surface of the glass substrate 11 or reducing defects of the main surface of the glass substrate 11. As a material of such an underlayer 21, use is made of a material having translucency for exposure light in the case of use for the binary mask blank or the phase shift mask blank. For example, in the case of the mask blank for KrF excimer laser exposure or ArF excimer laser exposure, use is preferably made of Si or a silicon compound containing Si (e.g. $SiO_2$ or SiON).

In the case of the reflective mask blank for EUV exposure, the underlayer 21 does not need to have translucency for exposure light and use is preferably made of a material that can obtain high smoothness when the surface of the underlayer 21 is precision-polished and that is excellent in defect quality. In terms of high smoothness, the underlayer 21 is preferably made of a material having a high film density and/or an amorphous structure. For example, Si or a silicon compound containing Si (e.g. $SiO_2$ or SiON) is preferably used because high smoothness is obtained when precision-polished and the defect quality is excellent. Si is particularly preferable. In particular, a Si film formed by ion-beam sputtering is preferable.

In terms of recycling of the glass substrate 11, it is preferable to select, as the material of the underlayer 21, a material that can be removed by etching with an etchant which gives little damage to the glass substrate 11, i.e. which has etching selectivity, specifically with a chlorine-based gas. As the material that can be removed by etching with the chlorine-based gas, it is preferable to use, for example, Al, Ta, Zr, Ti, Cr, or a material containing at least one of those elements (e.g. a compound containing one of the elements and further containing oxygen, nitrogen, or carbon). In terms of high smoothness, it is more preferable that the underlayer 21 be made of a material having a high film density and/or an amorphous structure. Al, Ta, Zr, Ti, Cr, or the material containing at least one of the metal elements cited above may contain boron (B). Among them, the material containing the metal element and nitrogen is preferable because high smoothness can be obtained. In particular, Ta, Cr, or its nitride (TaN, TaBN, CrN, CrBN) is preferable.

It is important that the surface of the underlayer 21 be precision-polished so as to have a surface roughness which is required as a substrate for a mask blank. This is because it is possible to reduce background noise due to the surface roughness and thus to suppress false defect detection in a highly sensitive defect inspection apparatus and, as a result, it is possible to improve the detection accuracy of a defect position or the like using the fiducial mark 22 as a reference. It is preferable to select a material of the underlayer 21 and precision-polish the surface of the underlayer 21 so that its surface roughness in RMS becomes 0.15 nm or less, particularly preferably 0.1 nm or less, and further preferably 0.08 nm or less. In consideration of the influence on the surface of the multilayer reflective film which is formed on the underlayer 21, it is preferable to select a material of the underlayer 21 and precision-polish the surface of the underlayer 21 so that the ratio of Rmax (maximum surface roughness, namely, surface roughness in maximum height)/RMS becomes 2 to 10 and particularly preferably 2 to 8.

In this invention, the underlayer is not necessarily a single layer and may have a laminated structure of different materials.

The thickness of the underlayer is properly set mainly in terms of fiducial mark formation, fiducial mark identification, productivity, and so on. In the case where a fiducial mark having a concave or convex cross-sectional shape is formed, the thickness of the underlayer is preferably set in a range of 20 nm to 300 nm in terms of the above-mentioned aspects. At least the multilayer reflective film and the absorber layer are formed on the underlayer in the reflective mask blank for EUV exposure while the light-shielding film, the phase shift film, or the like is formed on the underlayer in the mask blank for KrF excimer laser exposure or ArF excimer laser exposure. Therefore, taking into account that the concave or convex fiducial mark can be identified in such a mask blank, the thickness of the underlayer is preferably in a range of 75 nm to 300 nm and more preferably in a range of 100 nm to 300 nm.

Next, the fiducial mark which provides a reference for a defect position in defect information will be described in detail.

In this invention, the fiducial mark is formed on the underlayer and does not reach the glass substrate. Herein, "the fiducial mark does not reach the glass substrate" means that trace of the formation of the fiducial mark is not substantially formed on the main surface of the glass substrate. Herein, "trace of the formation of the fiducial mark is not substantially formed on the main surface of the glass substrate" includes a case where trace of the formation of the fiducial mark is formed on the main surface of the glass substrate to a degree that does not require machining to remove a certain amount of the main surface of the glass substrate in order to remove the trace of the formation of the fiducial mark. For example, in the case of a concave fiducial mark, the maximum depth of the fiducial mark is equal to the thickness of the underlayer. Since the fiducial mark is formed on the underlayer, there is the advantage that, as described above, the glass substrate can be recycled.

The fiducial mark provides a reference for a defect position in defect information of the mask blank glass substrate or the mask blank. The shape and size of such a fiducial mark are not particularly limited as long as it can be recognized for an electron beam in electron-beam writing or inspection light of a defect inspection apparatus, and are properly set. In FIG. 3, as one example, there is formed the fiducial mark 22 which has a concave cross-sectional shape and which can be recognized by providing a required depth in its height direction.

When the fiducial mark is recognized by providing the required depth or height level difference in its height direction (i.e. the thickness direction of the underlayer), the cross-sectional shape of the fiducial mark is not limited to the concave shape as shown in FIG. 3 and may be a convex shape, a combination of concave and convex shapes, or the like. When the fiducial mark is recognized by providing optical contrast, its cross-sectional shape is not necessarily the above-mentioned concave or convex shape and, for example, may be substantially flat.

Figure 1:
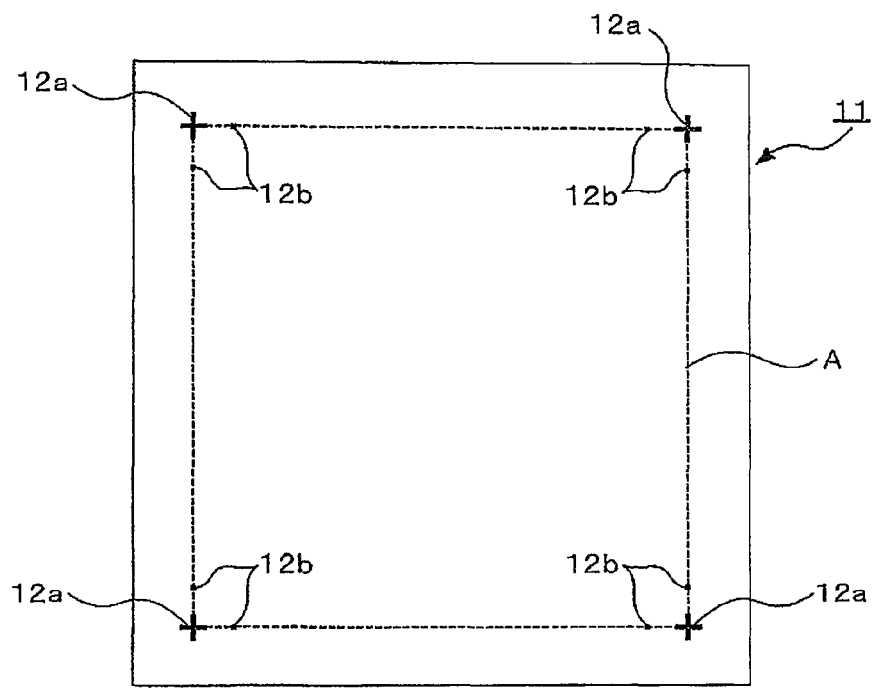
FIG. 1 is a plan view of a mask blank glass substrate showing an example of the arrangement of fiducial marks.
Figure 2:
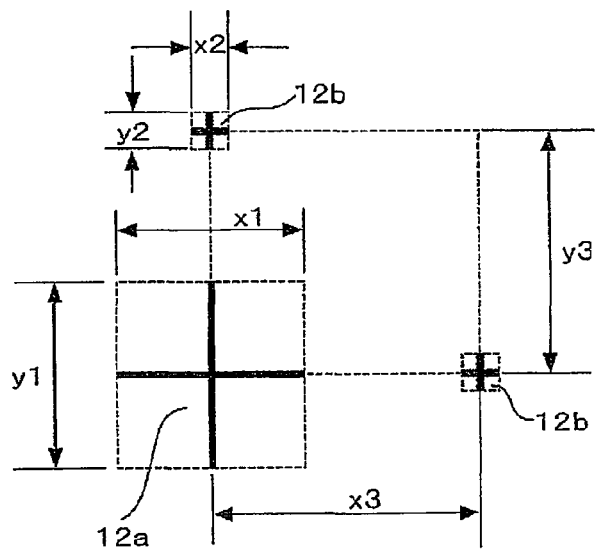
FIG. 2 is a diagram showing examples of the shapes of the fiducial marks.

FIG. 1 is a plan view of a mask blank glass substrate showing an example of the arrangement of fiducial marks and FIG. 2 is a diagram showing examples of the shapes of the fiducial marks.

In FIG. 1, two kinds of marks, i.e. relatively large rough alignment marks 12a and relatively small fine marks 12b, are formed as fiducial marks. Although the fiducial marks are shown on a main surface of a glass substrate 11 in FIG. 1, this does not mean that the fiducial marks are formed directly on the glass substrate. FIG. 1 only shows the example of the arrangement of the fiducial marks over the main surface of the glass substrate. In this invention, the fiducial marks are formed on the underlayer.

The fine mark 12b has a role of a fiducial mark which provides a reference for a defect position in defect information of a mask blank glass substrate or a mask blank while the rough alignment mark 12a itself has no role of a fiducial mark, but serves to facilitate detection of the position of the fine mark 12b. Since the size of the fine mark 12b is small, it is difficult to locate the position of the fine mark 12b by visual observation. On the other hand, if an attempt is made to detect the fine mark 12b using an electron beam or inspection light from the beginning, the detection takes time and, thus, if a resist film is formed, there is a possibility of causing unwanted resist exposure, which is thus not preferable. By providing the rough alignment mark 12a whose positional relationship with the fine mark 12b is determined in advance, the fine mark 12b can be detected quickly and easily.

FIG. 1 shows the example in which the rough alignment marks 12a are arranged at four positions near corners of the main surface of the rectangular glass substrate 11 and the fine marks 12b are arranged at two positions near each of the rough alignment marks 12a. The rough alignment marks 12a and the fine marks 12b are preferably formed on a boundary line of a pattern forming region, defined by a broken line A, of the substrate main surface or on the outer peripheral side outside the pattern forming region. However, if it is too close to the outer peripheral edge, it may be a region where the flatness of the substrate main surface is poor or there is a possibility of crossing another kind of identification mark, which is thus not preferable.

In the example shown in FIG. 1, the rough alignment marks 12a and the fine marks 12b each have a cross shape. The size and width of the mark, the depth of the mark when it has a concave shape, and so on can be arbitrarily set as long as it can be recognized for an electron beam in electron-beam writing or inspection light of a defect inspection apparatus. Specifically, in FIG. 2, in the case of the rough alignment mark 12a, a dimension x1 in the x-direction and a dimension y1 in the y-direction can each be set to 0.55 mm, the line width of the cross shape can be set to 5 µm, and the depth of the cross shape can be set to 100 nm, while, in the case of the fine mark 12b, a dimension x2 in the x-direction and a dimension y2 in the y-direction can each be set to 0.1 mm, the line width of the cross shape can be set to 5 µm, and the depth of the cross shape can be set to 100 nm. Further, in FIG. 2, a distance x3 in the x-direction between the centers of the rough alignment mark 12a and the fine mark 12b and a distance y3 in the y-direction between the centers of the rough alignment mark 12a and the fine mark 12b can each be set to 1.5 mm.

The shapes and arrangement of the fiducial marks shown in FIGS. 1 and 2 are only one specific example and this invention is not limited thereto. The rough alignment marks 12a are not essential and only the fine marks 12b may be sufficient.

The mask blank glass substrate of this invention described above is such that, on the main surface, on the side where the transfer pattern is to be formed, of the glass substrate, the underlayer serving to reduce the surface roughness of the main surface of the glass substrate or to reduce the defects of the main surface of the glass substrate is formed, and the surface of the underlayer is the precision-polished surface. Therefore, the surface of the underlayer has high smoothness. Since the fiducial mark which provides the reference for the defect position in the defect information is formed on this underlayer having the high surface smoothness, it is possible to reduce background noise due to the surface roughness and thus to suppress false defect detection in a highly sensitive defect inspection apparatus and, as a result, it is possible to improve the detection accuracy of a defect position or the like using the fiducial mark as the reference. Further, since the fiducial mark is formed on the underlayer, in the case of a mask blank whose surface defect is found after forming a pattern-formation thin film on the underlayer or in the case of a transfer mask which is produced using a mask blank and in which a pattern defect that is difficult to correct is found, it is possible to recycle the glass substrate by stripping and removing the thin film and the underlayer from the glass substrate without discarding the mask blank or the transfer mask as a defective.

[Mask Blank Glass Substrate Manufacturing Method]

Next, a description will be given of a method of manufacturing the mask blank glass substrate described above.

This invention also provides the mask blank glass substrate manufacturing method.

The mask blank glass substrate manufacturing method of this invention comprises a surface machining process of carrying out surface machining so that a main surface of a glass substrate has a predetermined flatness, an underlayer forming process of forming an underlayer on the main surface of the glass substrate, the underlayer serving to reduce surface roughness of the main surface of the glass substrate or to reduce defects of the main surface of the glass substrate, a precision polishing process of carrying out precision polishing so that a surface of the underlayer has a predetermined surface roughness, and a fiducial mark forming process of forming a fiducial mark on the underlayer, the fiducial mark providing a reference for a defect position in defect information.

Figure 9:
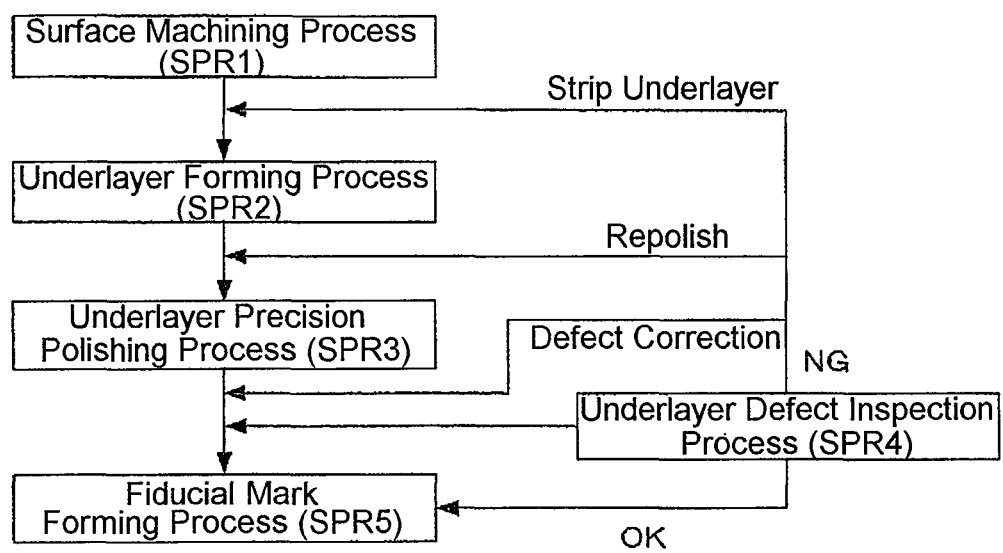
FIG. 9 is a flowchart for explaining a mask blank glass substrate manufacturing method of this invention.
Figure 10:
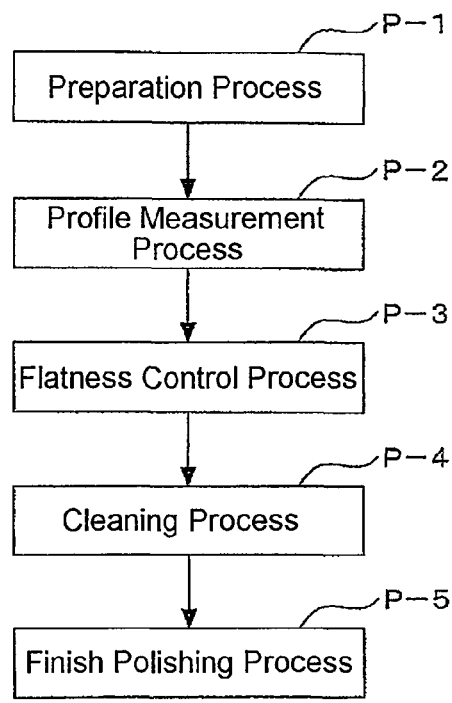
FIG. 10 is a flowchart for explaining a surface machining process in the mask blank glass substrate manufacturing method of this invention.

FIG. 9 is a flowchart for explaining the mask blank glass substrate manufacturing method of this invention and FIG. 10 is a flowchart for explaining the surface machining process in the mask blank glass substrate manufacturing method of this invention. A description will be given with reference to these figures.

<Surface Machining Process>

The surface machining process comprises Preparation Process (P-1) of preparing a glass substrate, Profile Measurement Process (P-2) of measuring the convex/concave profile of a glass substrate surface, Flatness Control Process (P-3) of controlling the flatness of the glass substrate surface by local machining, Cleaning Process (P-4) of cleaning the glass substrate surface, and Finish Polishing Process (P-5) of finish-polishing the glass substrate surface (see FIG. 10).

[Preparation Process]

The preparation process is a process of preparing a glass substrate whose one or both surfaces are precision-polished to a surface roughness of about 0.4 nm or less in RMS. Normally, this preparation process comprises a rough polishing process of rough-polishing both surfaces of the glass substrate and a precision polishing process of precision-polishing one or both surfaces of the rough-polished glass substrate so that stepwise polishing is carried out. In this event, in the rough polishing process, use is made of, for example, a polishing agent in which cerium oxide having a relatively large abrasive particle size is dispersed, while, in the precision polishing process, use is made of, for example, a polishing agent in which colloidal silica having a relatively small abrasive particle size is dispersed.

[Profile Measurement Process]

The profile measurement process is a step of measuring the convex/concave profile (flatness) of the surface of the glass substrate prepared in the preparation process. An optical interferometer is normally used for measuring the convex/concave proflie (flatness) of the glass substrate surface. The optical interferometer may be, for example, a fringe observation interferometer or a phase shift interferometer. Profile measurement results measured by the optical interferometer are stored in a recording medium such as a computer.

Then, the profile measurement results and a predetermined reference value (required flatness) are compared with each other by an arithmetic processing means such as a computer and the difference is calculated per predetermined region (e.g. 5 mm×5 mm region) of the glass substrate surface. That is, a machining allowance is set according to the height of a convex portion of the glass substrate surface. This difference (machining allowance) is set as a required removal amount of each predetermined region in local surface machining.

[Flatness Control Process]

The flatness control process is a process of locally machining the convex portion per predetermined region under a machining condition according to the machining allowance set by the arithmetic processing described above, thereby controlling the flatness of the glass substrate surface at the predetermined value or less.

As a local surface machining method, use can be made of an MRF (magnetorheological finishing) method which brings a magnetic polishing slurry containing abrasive particles in an ion-containing magnetic fluid into local contact with a glass substrate surface. Other than the MRF method, use may be made of a local machining method using GCIB (gas cluster ion beam) or plasma etching.

[Cleaning Process]

A glass substrate cleaning method is not particularly limited. However, when the MRF method is used in the flatness control process, there is a case where the iron component contained in the magnetic fluid is, although a little, adhering to the glass substrate surface, and therefore, it is preferable to carry out acid cleaning using, for example, hydrochloric acid, thereby dissolving and removing the iron component adhering to the glass substrate surface.

As a cleaning method, it is optional to use a dipping method that dips a glass substrate in a cleaning bath, a method that supplies a cleaning liquid to a glass substrate surface using a nozzle, or the like. Further, according to need, the cleaning performance may be enhanced by applying ultrasonic wave or carrying out scrub cleaning.

[Finish Polishing Process]

When surface roughening or formation of a modified layer due to machining occurs on the glass substrate surface in the above-mentioned flatness control process, finish polishing is carried out for the purpose of removing them. Accordingly, if there is no such occurrence on the glass substrate surface, the finish polishing is not necessarily carried out.

As a method of this finish polishing, it is preferable to use a polishing method that can improve the surface roughness while maintaining the flatness obtained in the flatness control process. For example, there can be cited a method that carries out precision polishing with a polishing liquid while a surface of a polishing tool such as a polishing pad is in contact with a glass substrate main surface, a non-contact polishing method (e.g. float polishing or EEM (elastic emission machining)) that carries out polishing by the action of a machining liquid interposed between a glass substrate main surface and a polishing tool surface while both are not in direct contact with each other, or the like.

<Underlayer Forming Process>

An underlayer forming method is not particularly limited. For example, there can be cited DC sputtering, RF sputtering, ion-beam sputtering, or CVD. The material of an underlayer is as described before.

Particularly, in this invention, it is preferable to form an underlayer which is uniform in the substrate plane while maintaining high flatness obtained in the above-mentioned surface machining process. For example, when forming an underlayer by sputtering using a film forming apparatus as shown in FIG. 11, it is preferable to provide a positional relationship between a substrate and a target as shown in FIG. 12.

Figure 11:
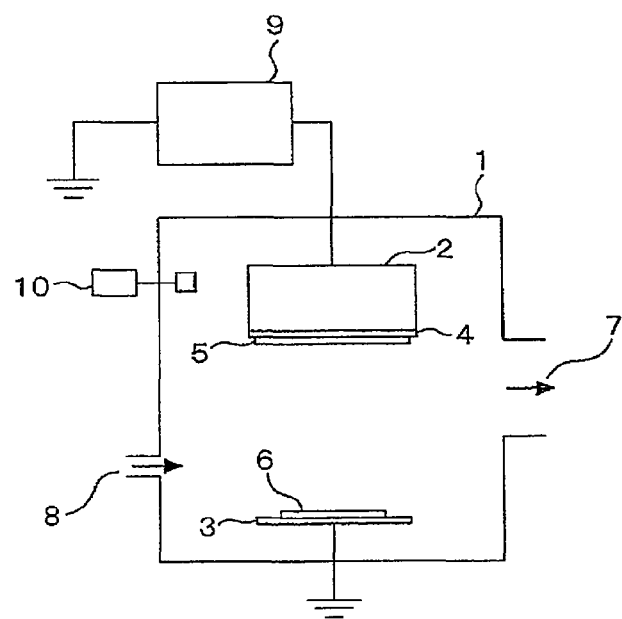
FIG. 11 is a diagram showing a schematic structure of a DC magnetron sputtering apparatus.

FIG. 11 shows the structure of a general DC magnetron sputtering apparatus. The apparatus has a film forming chamber (vacuum vessel) 1 in which a magnetron cathode 2 and a substrate holder 3 are disposed. A sputtering target 5 bonded to a backing plate 4 is attached to the magnetron cathode 2. A glass substrate 6 is placed on the substrate holder 3. The film forming chamber 1 is evacuated by a vacuum pump through an exhaust port 7. After an atmosphere in the film forming chamber 1 reaches a predetermined vacuum degree, a film forming gas is introduced into the film forming chamber 1 through a gas inlet port 8 and a negative voltage is applied to the magnetron cathode 2 using a DC power supply 9, thereby carrying out sputtering. The pressure in the film forming chamber 1 is measured by a pressure gauge 10.

Figure 12:
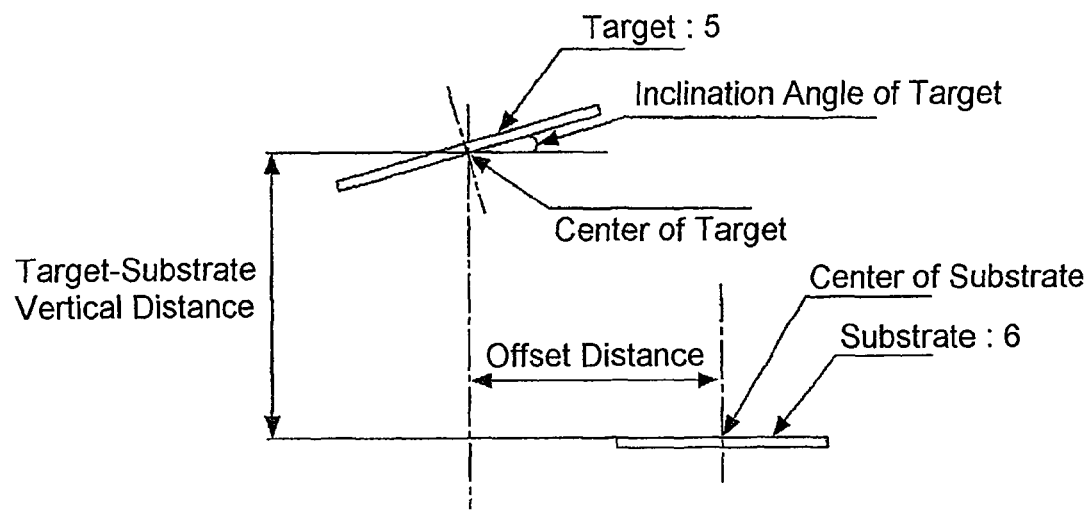
FIG. 12 is an exemplary diagram for explaining the positional relationship between a sputtering target and a substrate.

As shown in FIG. 12, the substrate 6 and the sputtering target 5 are disposed so that facing surfaces thereof have a predetermined angle therebetween. Specifically, the target 5 is disposed at a position where a straight line passing through the center of the target 5 and parallel to the central axis of the substrate 6 is offset by a predetermined distance from the central axis of the substrate 6, and faces a film-forming surface of the substrate 6 so as to be inclined by a predetermined angle with respect to the film-forming surface of the substrate 6. A thin film (underlayer) is formed by sputtering the target 5 while horizontally rotating the substrate 6 with its film-forming surface facing upward. The inclination angle of the target 5 is preferably set to, for example, about 10 to 30 degrees. The distance (offset distance) between the central axis of the substrate 6 and the straight line passing through the center of the target 5 and parallel to the central axis of the substrate 6 is preferably set to, for example, about 200 mm to 350 mm. Further, the vertical distance between the target 5 and the substrate 6 is preferably set to, for example, about 200 mm to 380 mm.

Figure 13:
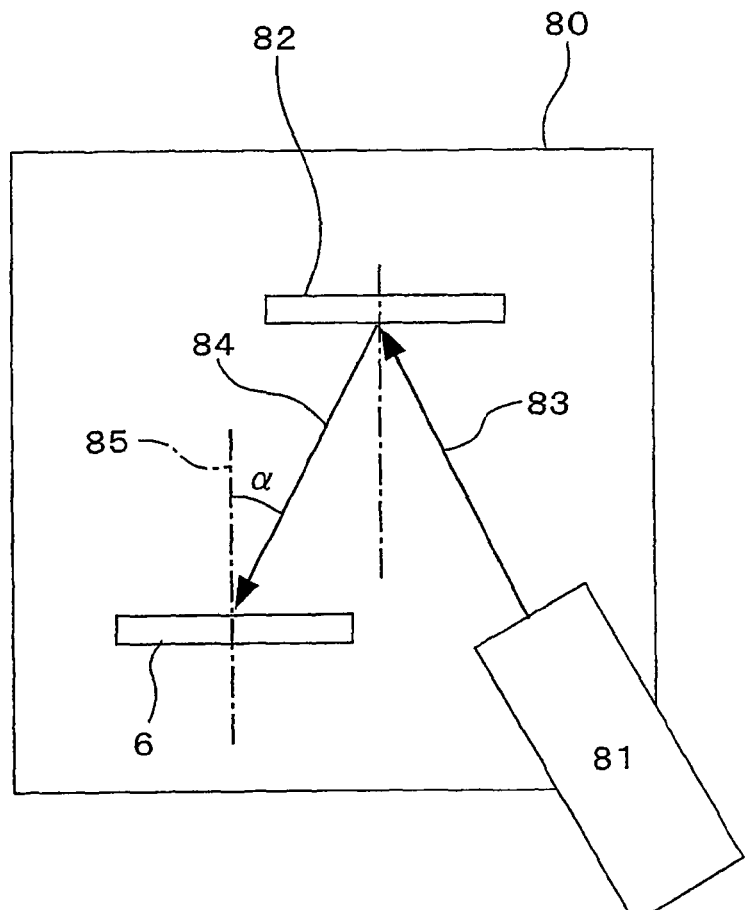
FIG. 13 is a conceptual diagram of a film forming apparatus for ion-beam sputtering.

When forming an underlayer by ion-beam sputtering, it is preferable to define a relationship in terms of an incident angle with respect to a normal of a substrate main surface as shown in FIG. 13.

FIG. 13 is a conceptual diagram of a film forming apparatus 80 for ion-beam sputtering. In FIG. 13, there is shown an incident angle α of sputtering particles 84 with respect to a normal 85 of a main surface of a substrate 6 in ion-beam sputtering. The incident angle α of the sputtering particles 84 is preferably set to 5 to 80 degrees. The sputtering particles 84 are generated when an ion beam 83 emitted from an ion-beam generating apparatus 81 is incident on a sputtering target 82. The substrate 6 is placed with its film-forming surface facing the sputtering target 82 so that the incident angle α of the sputtering particles 84 falls within the above-mentioned angle range. An underlayer is formed by ion-beam sputtering while rotating the substrate 6.

When forming the underlayer by sputtering such as DC magnetron sputtering or ion-beam sputtering, by setting the positional relationship between the substrate and the target or the incident angle α of the sputtering particles as shown in FIG. 12 or 13, it is possible to reduce variation in film thickness in the substrate plane to thereby form the uniform underlayer while maintaining high flatness obtained in the above-mentioned surface machining process.

<Underlayer Precision Polishing Process>

As a method of this underlayer precision polishing, use is made of a polishing method that can improve the surface roughness while maintaining the flatness obtained in the above-mentioned surface machining process. For example, there can be cited a method that carries out precision polishing with a polishing liquid while a surface of a polishing tool such as a polishing pad is in contact with a glass substrate main surface, a non-contact polishing method (e.g. float polishing or EEM (elastic emission machining)) that carries out polishing by the action of a machining liquid interposed between a glass substrate main surface and a polishing tool surface while both are not in direct contact with each other, or the like.

In the underlayer precision polishing process, precision polishing is carried out so that the underlayer has underlayer surface roughness smaller than main surface roughness of the glass substrate. Specifically, the precision polishing is performed so that the underlayer surface is not greater than 0.15 nm in RMS (root mean square roughness), preferably, not greater than 0.1 nm in RMS, and more preferably, not greater than 0.08 nm in RMS.

In order to obtain high smoothness, it is preferable to carry out precision polishing using a colloidal silica slurry in which the average particle size of a polishing abrasive is 100 nm or less, preferably 50 nm or less.

<Fiducial Mark Forming Process>

Details of the shapes, sizes, and so on of fiducial marks to be formed on the underlayer are as described before.

A fiducial mark forming method is not particularly limited. For example, when the cross-sectional shape of a fiducial mark is concave as shown in FIG. 3, the fiducial mark can be formed by photolithography, recess formation by laser light or an ion beam, machining trace by scanning a diamond stylus, indention by a micro-indenter, stamping by an imprint method, or the like. When the cross-sectional shape of a fiducial mark is convex, the fiducial mark can be formed by partial film formation by FIB (focused ion beam), sputtering, or the like.

In terms of the fiducial mark shape control, the fiducial mark forming process is preferably carried out after the above-mentioned underlayer precision polishing process.

<Underlayer Defect Inspection Process>

In this invention, the defect inspection process which carries out a defect inspection of the underlayer is preferably provided between the above-mentioned underlayer precision polishing process and the above-mentioned fiducial mark forming process.

The defect inspection of the underlayer can be carried out using a general defect inspection apparatus. When carrying out the defect inspection, measurement data of the defect inspection preferably includes the size and number of defects. As a result of the defect inspection, the glass substrate with the underlayer judged to be successful is subjected to the above-mentioned fiducial mark forming process. On the other hand, for the glass substrate with the underlayer judged to be unsuccessful, it is preferable to selectively carry out defect correction when a defect is correctable, repolishing of the surface of the underlayer, or recycling of the glass substrate by stripping the underlayer (an underlayer will be formed again).

As described above, according to the mask blank glass substrate manufacturing method of this invention, on the main surface, on the side where a transfer pattern is to be formed, of the glass substrate, it is possible to form the underlayer serving to reduce the surface roughness of the main surface of the glass substrate or to reduce the defects of the main surface of the glass substrate and having high surface smoothness, and the fiducial mark which provides the reference for the defect position in the defect information is formed on this underlayer. Therefore, it is possible to reduce background noise due to the surface roughness and thus to suppress false defect detection in a highly sensitive defect inspection apparatus and, as a result, it is possible to improve the detection accuracy of a defect position or the like using the fiducial mark as the reference. Further, since the fiducial mark is formed on the underlayer, in the case of a mask blank whose surface defect is found after forming a pattern-formation thin film on the underlayer or in the case of a transfer mask which is produced using a mask blank and in which a pattern defect that is difficult to correct is found, it is possible to recycle the glass substrate by stripping and removing the thin film and the underlayer from the glass substrate without discarding the mask blank or the transfer mask as a defective.

[Multilayer Reflective Film Coated Substrate]

Figure 4:
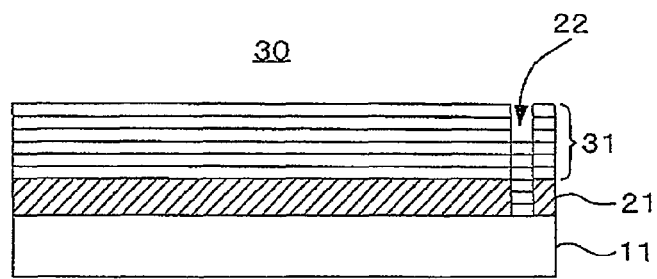
FIG. 4 is a cross-sectional view of a multilayer reflective film coated substrate according to an embodiment of this invention.

As shown in FIG. 4, this invention also provides a multilayer reflective film coated substrate 30 in which a multilayer reflective film 31 adapted to reflect EUV light is formed on the surface of the underlayer 21 of the mask blank glass substrate 20 having the above-mentioned structure.

The multilayer reflective film 31 adapted to reflect the EUV light is formed on the surface of the underlayer 21 of the mask blank glass substrate 20 having the above-mentioned structure. As a consequence, there is obtained the multilayer reflective film coated substrate 30 that is formed with the fiducial mark 22, that has high surface smoothness, and that enables recycling of the glass substrate 11.

The multilayer reflective film 31 is a multilayer film in which low refractive index layers and high refractive index layers are alternately laminated. Generally, use is made of a multilayer film in which thin films of a heavy element or its compound and thin films of a light element or its compound are alternately laminated by about 40 to 60 cycles.

For example, as a multilayer reflective film for EUV light having a wavelength of 13 nm to 14 nm, use is preferably made of a Mo/Si cycle multilayer film in which Mo films and Si films are alternately laminated by about 40 cycles. Other than this, as a multilayer reflective film for use in a region of EUV light, there is a Ru/Si cycle multilayer film, a Mo/Be cycle multilayer film, a Mo compound/Si compound cycle multilayer film, a Si/Nb cycle multilayer film, a Si/Mo/Ru cycle multilayer film, a Si/Mo/Ru/Mo cycle multilayer film, a Si/Ru/Mo/Ru cycle multilayer film, or the like. The material may be properly selected according to an exposure wavelength.

[Mask Blank]

This invention also provides a mask blank in which a thin film to be a transfer pattern is formed on the underlayer of the mask blank glass substrate having the above-mentioned structure or on the multilayer reflective film of the multilayer reflective film coated substrate having the above-mentioned structure.

Since the thin film to be the transfer pattern is formed on the underlayer of the mask blank glass substrate having the above-mentioned structure or on the multilayer reflective film of the multilayer reflective film coated substrate having the above-mentioned structure, there is obtained the mask blank that is formed with the fiducial mark, that has high surface smoothness, and that enables recycling of the glass substrate.

The above-mentioned multilayer reflective film coated substrate can be used as a substrate for a reflective mask blank which is adapted for use in the manufacture of a reflective mask, that is, which comprises, in order, on a substrate, a multilayer reflective film adapted to reflect exposure light and an absorber film for pattern formation adapted to absorb the exposure light.

Figure 5:
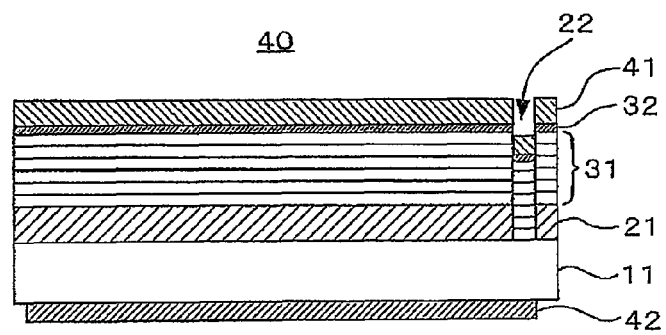
FIG. 5 is a cross-sectional view of a reflective mask blank according to an embodiment of this invention.

FIG. 5 shows a reflective mask blank 40 in which a protective film (capping layer) 32 and an absorber film 41 for pattern formation adapted to absorb EUV light are formed in this order on the multilayer reflective film 31 of the multilayer reflective film coated substrate 30 of FIG. 4. On the side, opposite to the side where the multilayer reflective film and so on are formed, of the glass substrate 11, a back-side conductive film 42 is provided.

The absorber film 41 has the function of absorbing exposure light such as EUV light and is preferably made of, for example, tantalum (Ta) alone or a material composed mainly of Ta. As the material composed mainly of Ta, use is made of a material containing Ta and B, a material containing Ta and N, a material containing Ta and B and further containing at least one of O and N, a material containing Ta and Si, a material containing Ta, Si, and N, a material containing Ta and Ge, a material containing Ta, Ge, and N, or the like.

Normally, for the purpose of protecting the multilayer reflective film 31 in patterning the absorber film 41 or in pattern correction, the protective film 32 or a buffer film is provided between the multilayer reflective film 31 and the absorber film 41. As a material of the protective film 32, use is made of silicon, ruthenium, or a ruthenium compound containing ruthenium and at least one of niobium, zirconium, and rhodium. As a material of the buffer film, a chromium-based material is mainly used.

Figure 6:
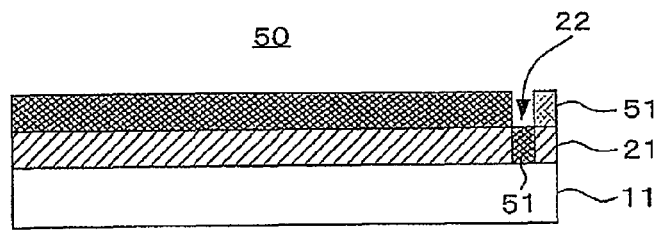
FIG. 6 is a cross-sectional view of a binary mask blank according to an embodiment of this invention.

FIG. 6 shows a binary mask blank 50 in which a light-shielding film 51 is formed on the underlayer 21 of the mask blank glass substrate 20 of FIG. 3.

Although not illustrated, a phase shift mask blank is obtained by forming a phase shift film or a phase shift film and a light-shielding film on the underlayer 21 of the mask blank glass substrate 20 of FIG. 3.

The light-shielding film may be in the form of a single layer or a plurality of layers (e.g. laminated structure of a light-shielding layer and an antireflection layer). When the light-shielding film has the laminated structure of the light-shielding layer and the antireflection layer, the light-shielding layer may have a structure comprising a plurality of layers. Likewise, the phase shift film may also be in the form of a single layer or a plurality of layers.

As such a mask blank, there can be cited, for example, a binary mask blank having a light-shielding film made of a material containing chromium (Cr), a binary mask blank having a light-shielding film made of a material containing a transition metal and silicon (Si), a binary mask blank having a light-shielding film made of a material containing tantalum (Ta), or a phase shift mask blank having a phase shift film made of a material containing silicon (Si) or a material containing a transition metal and silicon (Si).

As the material containing chromium (Cr), there can be cited chromium alone or a chromium-based material (e.g. CrO, CrN, CrC, CrON, CrCN, CrOC, or CrOCN).

As the material containing tantalum (Ta), there can be cited tantalum alone, a compound of tantalum and another metal element (e.g. Hf or Zr), or a material containing tantalum and at least one of nitrogen, oxygen, carbon, and boron, such as a material containing TaN, TaO, TaC, TaB, TaON, TaCN, TaBN, TaCO, TaBO, TaBC, TaCON, TaBON, TaBCN, or TaBCON.

As the material containing silicon (Si), there can be cited a material containing silicon and at least one of nitrogen, oxygen, and carbon. Specifically, it is preferable to use a material containing silicon nitride, silicon oxide, silicon carbide, silicon oxynitride, silicon carboxide, or silicon carboxynitride.

As the material containing a transition metal and silicon (Si), there can be cited, other than a material containing a transition metal and silicon, a material containing a transition metal and silicon and further containing at least one of nitrogen, oxygen, and carbon. Specifically, it is preferable to use a material containing a transition metal silicide, a transition metal silicide nitride, a transition metal silicide oxide, a transition metal silicide carbide, a transition metal silicide oxynitride, a transition metal silicide carboxide, or a transition metal silicide carboxynitride. As the transition metal, use can be made of molybdenum, tantalum, tungsten, titanium, chromium, hafnium, nickel, vanadium, zirconium, ruthenium, rhodium, niobium, or the like. Among them, molybdenum is particularly preferable.

[Mask]

This invention also provides a mask in which the thin film of the mask blank having the above-mentioned structure is patterned.

When a pattern defect that is difficult to correct is found, the mask having such a structure enables recycling of the glass substrate by stripping and removing the thin film, the underlayer, etc. from the glass substrate.

Figure 7:
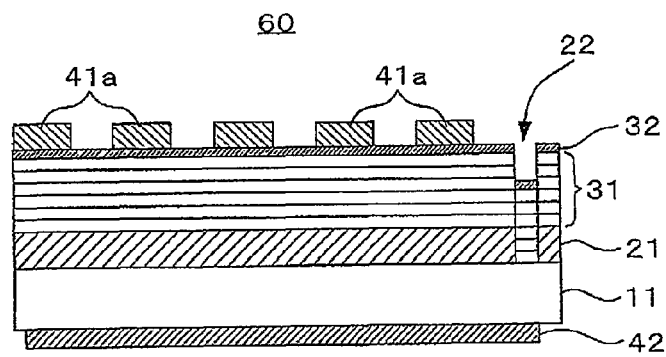
FIG. 7 is a cross-sectional view of a reflective mask according to an embodiment of this invention.

FIG. 7 shows a reflective mask 60 having an absorber film pattern 41a obtained by patterning the absorber film 41 of the reflective mask blank 40 of FIG. 5.

Figure 8:
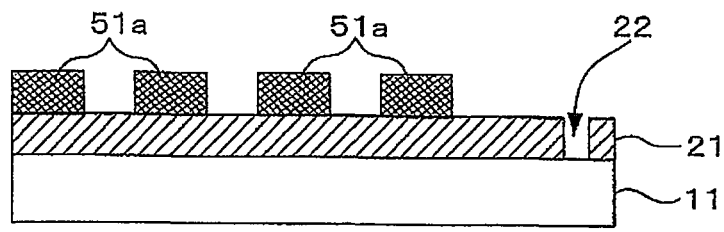
FIG. 8 is a cross-sectional view of a binary mask according to an embodiment of this invention.

FIG. 8 shows a binary mask 70 having a light-shielding film pattern 51a obtained by patterning the light-shielding film 51 of the binary mask blank 50 of FIG. 6.

As a method of patterning the thin film of the mask blank, the photolithography is the most suitable.

Although not illustrated, in the case of the phase shift mask blank having the phase shift film or the phase shift film and the light-shielding film on the underlayer of the above-mentioned mask blank glass substrate, a phase shift mask is obtained by patterning the phase shift film.

In this invention, a defect inspection apparatus for obtaining defect information is not particularly limited. As a wavelength of inspection light for use in the defect inspection apparatus, 532 nm, 488 nm, 266 nm, 193 nm, 13.5 nm, or the like is available.

EXAMPLES

Hereinbelow, the embodiments of this invention will be described in further detail with reference to Examples.

Example 1

Surface Machining Process (SPR1)

A $SiO_2$—$TiO_2$-based glass substrate (size: about 152.4 mm×about 152.4 mm, thickness: about 6.35 mm) was prepared. Specifically, using a double-side polishing machine, both front and back surfaces of the glass substrate were polished stepwise with cerium oxide abrasive particles and colloidal silica abrasive particles and then treated with low-concentration fluorosilicic acid. The surface roughness of the prepared glass substrate, measured by AFM (atomic force microscope), was 0.25 nm in RMS (measurement region: 1 μm×1 μm).

The surface shape (flatness) of both front and back surfaces of the glass substrate was measured by a flatness measuring apparatus (UltraFlat: manufactured by Tropel Corporation) (measurement region: 148 mm×148 mm).

As a result, the flatness of the front and back surfaces of the glass substrate was about 290 nm.

The surface shape (flatness) measurement results of the front and back surfaces of the glass substrate were each stored in a computer as height information with respect to a reference plane per measurement point. Using the computer, the measurement results were compared with a front surface flatness reference value of 100 nm or less and a back surface flatness reference value of 100 nm or less required for the glass substrate, thereby calculating differences (required removal amounts).

Then, a local surface machining condition according to the required removal amount was set per machining spot shape region of the glass substrate.

Using a dummy substrate in advance, the dummy substrate was machined in a spot in the same manner as actual machining for a predetermined time without moving the dummy substrate and its shape was measured by the same flatness measuring apparatus described above, thereby calculating a machining volume of the spot per unit time. Then, according to the spot information and the required removal amounts obtained by the surface shape information of the glass substrate, the scan speed for raster scanning of the glass substrate was determined.

According to the set machining conditions, local surface machining was carried out by the MRF (magnetorheological finishing) method using a magnetic-fluid substrate finishing apparatus so as to cause the flatness of the front and back surfaces of the glass substrate to be the above-mentioned reference value or less, thereby adjusting the surface shape of the glass substrate.

Cerium oxide was used as a polishing slurry.

Thereafter, the glass substrate was immersed in a cleaning bath containing a hydrochloric acid aqueous solution for about 10 minutes, then rinsed with pure water and dried with isopropyl alcohol (IPA).

The surface shape (flatness) of the front and back surfaces of the glass substrate was measured. As a result, in a 142 mm×142 mm measurement region, the flatness of the front and back surfaces of the glass substrate was 80 nm and thus satisfied the target value of 100 nm or less.

Underlayer Forming Process (SPR2)

Then, using a B-doped Si target and using a mixed gas of Ar and He as a sputtering gas, DC magnetron sputtering (sputtering described in Japanese Patent (JP-B) No. 4137667) was carried out to form a Si underlayer having a thickness of 100 nm. Then, stress reduction treatment was carried out by applying thermal energy to the Si underlayer. The application of thermal energy may be carried out by applying light energy using a xenon lamp or a halogen lamp or by high-temperature treatment using a high-temperature bath.

Underlayer Precision Polishing Process (SPR3)

Thereafter, in order to maintain the surface shape and to reduce the surface roughness, a surface of the Si underlayer was precision-polished using a single-side polishing machine.

In this precision polishing, use was made of a polishing slurry containing a polishing abrasive of colloidal silica with an average particle size of 80 nm and adjusted to pH 10 or more. The surface load applied to the surface of the Si underlayer was set to 50 g/cm$^2$ or less and a suede pad was used as a polishing pad.

The surface shape (flatness) and the surface roughness of the surface of the Si underlayer were measured. As a result, in a 142 mm×142 mm measurement region, the flatness was 80 nm and thus satisfied the target value of 100 nm or less. Further, in a 1 μm×1 μm measurement region, the surface roughness was 0.08 nm in RMS and thus was excellent. Since the surface of the Si underlayer has an extremely high smoothness of 0.1 nm or less in RMS, background noise in a highly sensitive defect inspection apparatus is reduced, which is effective in terms of suppressing false defect detection.

Further, in a 1 μm×1 μm measurement region, the maximum surface roughness (namely, surface roughness in maximum height) (Rmax) was 0.60 nm and thus Rmax/RMS was 7.5. Accordingly, variation in surface roughness was satisfactorily small.

Underlayer Defect Inspection Process (SPR4)

Then, the surface of the Si underlayer was subjected to a defect inspection using a mask blank defect inspection apparatus (MAGICS M1350: manufactured by Lasertec Corporation) (inspection region: 142 mm×142 mm). As a result, the number of defects having a size of 60 nm was zero, which was satisfactory. Further, the surface of the Si underlayer was subjected to a defect inspection using a mask/mask blank defect inspection apparatus (Teron 600: manufactured by KLA-Tencor Corporation) (inspection region: 132 mm×132 mm). As a result, the number of detected defects was 16,457, which was significantly reduced as compared with a detected defect number of more than 100,000 of later-described Reference Example. With the detected defect number on this level, it is possible to detect the presence or absence of foreign matter or a critical defect such as a crack.

Fiducial Mark Forming Process (SPR5)

Then, a cross-shaped mark having a concave cross-sectional shape and having a predetermined size and width was formed at a predetermined portion of the Si underlayer by the photolithography. The fiducial mark was formed in the following manner.

A resist for electron-beam writing was spin-coated on the Si underlayer and then baked, thereby forming a resist film having a thickness of 200 nm. A fiducial mark was written on a predetermined portion of the resist film using an electron-beam writing apparatus and then development was carried out, thereby forming a resist pattern. Using the resist pattern as a mask, the Si underlayer was dry-etched with a fluorine-based gas ($CF_4$ gas), and then the resist film was removed by hot sulfuric acid, thereby forming a cross-shaped fiducial mark having a concave cross-sectional shape on the Si underlayer.

In this Example, as fiducial marks, rough alignment marks and fine marks were formed in the positional relationship as shown in FIG. 1. The rough alignment mark had a cross shape having a dimension of 0.55 mm, a line width of 5 μm, and a depth of 100 nm. The fine mark had a cross shape having a dimension of 0.1 mm, a line width of 5 μm, and a depth of 100 nm.

In this manner, an EUV mask blank glass substrate was obtained.

The cross-sectional shape of each fiducial mark was observed by AFM. As a result, the cross-section was substantially upright, which was satisfactory.

Multilayer Reflective Film Forming Process (SPR6)

Then, using an ion-beam sputtering apparatus, given that formation of a Si film (thickness: 4.2 nm) and a Mo film (thickness: 2.8 nm) formed one cycle, Si films and Mo films were laminated by 40 cycles to form a multilayer reflective film on the Si underlayer, thereby obtaining a multilayer reflective film coated substrate.

It was confirmed that the concave fiducial mark formed on the Si underlayer was also formed on the multilayer reflective film and could be sufficiently detected by an electron-beam writing apparatus or a mask blank inspection apparatus.

Multilayer Reflective Film Defect Inspection Process (SPR7)

Then, a surface of the multilayer reflective film was subjected to a defect inspection using a mask blank defect inspection apparatus (MAGICS M1350: manufactured by Lasertec Corporation) (inspection region: 142 mm×142 mm). As a result, the number of defects of the surface of the multilayer reflective film was 5, which was satisfactory. In this defect inspection, concave and convex defect position information using the above-mentioned fiducial marks as references and defect size information were obtained. As a consequence, defect information in which the multilayer reflective film coated substrate and these defect position information and defect size information were correlated with each other was obtained. The reflectance of the surface of the multilayer reflective film was evaluated by an EUV reflectometer. As a result, since variation in surface roughness of the underlayer was suppressed, the reflectance was 67%±0.2%, which was satisfactory.

With respect to the fiducial marks reflected and formed on the surface of the multilayer reflective film due to the fiducial marks formed on the underlayer, it was confirmed by the mask/mask blank defect inspection apparatus that each fiducial mark exhibited a contrast of as high as 0.51 for inspection light and thus could be accurately detected and further that it could be detected with high reproducibility because variation in defect detection position was as low as 90 nm. The contrast was obtained by "contrast=(Imax−Imin)/(Imax+Imin)" where the defect inspection light intensity at the bottom of the fiducial mark was Imin and the defect inspection light intensity on the surface of the multilayer reflective film other than the fiducial mark portion was Imax. With respect to the variation in defect detection position, a defect inspection was carried out five times and the variation in defect detection position was obtained from variation of detected defect positions based on reference coordinates. Further, the surface of the multilayer reflective film was subjected to a defect inspection using a mask/mask blank defect inspection apparatus (Teron 600: manufactured by KLA-Tencor Corporation) (inspection region: 132 mm×132 mm). As a result, the number of detected defects was 17,723, which was significantly reduced as compared with a detected defect number of more than 100,000 of later-described Reference Example. With the detected defect number on this level, it is possible to detect the presence or absence of foreign matter or a critical defect such as a crack.

EUV Reflective Mask Blank Manufacturing Process
(SPR8)

Then, using a DC magnetron sputtering apparatus, a capping layer (thickness: 2.5 nm) made of RuNb and an absorber layer in the form of a laminate of a TaBN film (thickness: 56 nm) and a TaBO film (thickness: 14 nm) were formed on the multilayer reflective film and, further, a CrN conductive film (thickness: 20 nm) was formed on the back side, thereby obtaining an EUV reflective mask blank.

Then, the obtained EUV reflective mask blank was subjected to a defect inspection using a mask blank defect inspection apparatus (MAGICS M1350: manufactured by Lasertec Corporation) (inspection region: 142 mm×142 mm). As a result, the number of defects of a surface of the EUV reflective mask blank was 7, which was satisfactory. In the same manner as described above, concave and convex defect position information using the above-mentioned fiducial marks as references and defect size information were obtained. As a consequence, defect information in which the EUV reflective mask blank and these defect position information and defect size information were correlated with each other was obtained. Further, the surface of the EUV reflective mask blank was subjected to a defect inspection using a mask/mask blank defect inspection apparatus (Teron 600: manufactured by KLA-Tencor Corporation) (inspection region: 132 mm×132 mm). As a result, the number of detected defects was 18,102, which was significantly reduced as compared with a detected defect number of more than 100,000 of later-described Reference Example. With the detected defect number on this level, it is possible to detect the presence or absence of foreign matter or a critical defect such as a crack.

EUV Reflective Mask Manufacturing Process
(SPR9)

Then, using the EUV reflective mask blank with the above-mentioned defect information, an EUV reflective mask was manufactured.

First, a resist for electron-beam writing was spin-coated on the EUV reflective mask blank and then baked, thereby forming a resist film.

Then, based on the defect information of the EUV reflective mask blank and further based on mask pattern data designed in advance, a selection was made among correction to mask pattern data having no influence on pattern transfer using an exposure apparatus, correction to mask pattern data added with correction pattern data when judged to have an influence on the pattern transfer, and correction to mask pattern data capable of reducing the load of defect correction after the manufacture of a mask in the case of a defect not curable by correction pattern data. Based on the corrected mask pattern data, a mask pattern was written on the resist film by an electron beam and then development was carried out, thereby forming a resist pattern.

Using the resist pattern as a mask, the TaBO film of the absorber layer was etched with a fluorine-based gas ($CF_4$ gas) while the TaBN film of the absorber layer was etched with a chlorine-based gas ($Cl_2$ gas), thereby forming an absorber layer pattern on the capping layer.

Then, the resist pattern remaining on the absorber layer pattern was removed by hot sulfuric acid, thereby obtaining an EUV reflective mask.

Example 2

In Example 1, a CrN underlayer (Cr: 90 at %, N: 10 at %) having an amorphous crystal structure was used instead of the Si underlayer. Specifically, using a Cr target and using a mixed gas of Ar, He, and $N_2$ as a sputtering gas, DC magnetron sputtering was carried out to form a CrN underlayer having a thickness of 100 nm.

A surface of the CrN underlayer was precision-polished in the same manner as in Example 1. As a result, in a 142 mm×142 mm measurement region, the flatness was 85 nm and thus satisfied the target value of 100 nm or less. Further, in a 1 μm×1 μm measurement region, the surface roughness was 0.10 nm in RMS and thus was satisfactory.

Since the surface of the CrN underlayer has an extremely high smoothness of 0.1 nm or less in RMS, background noise in a highly sensitive defect inspection apparatus is reduced, which is effective in terms of suppressing false defect detection.

Further, in a 1 μm×1 μm measurement region, the maximum surface roughness (namely, surface roughness in maximum height) (Rmax) was 0.95 nm and thus Rmax/RMS was 9.5. Accordingly, variation in surface roughness was satisfactorily small.

Then, the surface of the CrN underlayer was subjected to a defect inspection using a mask blank defect inspection apparatus (MAGICS M1350: manufactured by Lasertec Corporation) (inspection region: 142 mm×142 mm). As a result, the number of defects having a size of 60 nm was zero, which was satisfactory. Further, the surface of the CrN underlayer was subjected to a defect inspection using a mask/mask blank defect inspection apparatus (Teron 600: manufactured by KLA-Tencor Corporation) (inspection region: 132 mm×132 mm). As a result, the number of detected defects was 24,744, which was significantly reduced as compared with a detected defect number of more than 100,000 of later-described Reference Example. With the detected defect number on this level, it is possible to detect the presence or absence of foreign matter or a critical defect such as a crack.

Reference marks were formed on the CrN underlayer in the same manner as in Example 1 except that a mixed gas of $Cl_2$ and $O_2$ was used as an etching gas in dry etching using a resist pattern as a mask, thereby manufacturing an EUV mask blank glass substrate formed with the fiducial marks.

The cross-sectional shape of each fiducial mark was observed by AFM. As a result, the cross-section was substantially upright, which was satisfactory.

In the same manner as in Example 1, a multilayer reflective film was formed on the CrN underlayer to manufacture a multilayer reflective film coated substrate and then a RuNb capping layer, an absorber layer in the form of a laminate of a TaBN film and a TaBO film, and a conductive film were formed, thereby obtaining an EUV reflective mask blank.

In the state of the multilayer reflective film coated substrate, the reflectance of a surface of the multilayer reflective film was evaluated by an EUV reflectometer. As a result, like in Example 1, since variation in surface roughness of the underlayer was suppressed, the reflectance was 67%±0.3%, which was satisfactory.

The contrast of the fiducial marks and variation in defect detection position were evaluated in the same manner as in Example 1. As a result, with respect to each of the fiducial marks reflected and formed on the surface of the multilayer reflective film, the contrast for inspection light was 0.52 and variation in defect detection position was 93 nm using the mask/mask blank defect inspection apparatus, which was satisfactory. Further, the surface of the multilayer reflective film and a surface of the EUV reflective mask blank were subjected to a defect inspection using a mask blank defect inspection apparatus (MAGICS M1350: manufactured by Lasertec Corporation) (inspection region: 142 mm×142 mm) and a mask/mask blank defect inspection apparatus (Teron 600: manufactured by KLA-Tencor Corporation) (inspection region: 132 mm×132 mm). As a result, the number of defects and the number of detected defects were several and about 35,000, respectively. The number of detected defects was significantly reduced as compared with a detected defect number of more than 100,000 of later-described Reference Example. With the detected defect number on this level, it is possible to detect the presence or absence of foreign matter or a critical defect such as a crack.

Further, an EUV reflective mask was manufactured using the EUV reflective mask blank. Like in Example 1, the EUV reflective mask blank and the EUV reflective mask were also satisfactorily manufactured.

Example 3

Next, a description will be given of an example where, in Example 2, defects are found in the defect inspection of the underlayer so that the underlayer is stripped to recycle the glass substrate.

Since a number of defects having a size of 60 nm were detected in the defect inspection of the surface of the CrN underlayer using the mask blank defect inspection apparatus (MAGICS M1350: manufactured by Lasertec Corporation) (inspection region: 142 mm×142 mm), the CrN underlayer was entirely dry-etched with a mixed gas of $Cl_2$ and $O_2$ to be removed.

In this case, the $SiO_2$—$TiO_2$-based glass is not etched with the mixed gas of $Cl_2$ and $O_2$. Therefore, the surface roughness of the main surface of the glass substrate after stripping the CrN underlayer was measured to be 0.4 nm in RMS. The flatness was 80 nm and thus was satisfactory.

After stripping the CrN underlayer, the glass substrate was cleaned with an alkaline aqueous solution and then a CrN underlayer was formed again on the main surface of the glass substrate. Thereafter, a surface of the CrN underlayer was precision-polished in the same manner as in Example 2. The flatness and the surface roughness of the surface of the CrN underlayer were measured. As a result, in a 142 mm×142 mm measurement region, the flatness was 85 nm and thus satisfied the target value of 100 nm or less. Further, in a 1 μm×1 μm measurement region, the surface roughness was 0.10 nm in RMS and thus was satisfactory.

Further, in a 1 μm×1 μm measurement region, the maximum surface roughness (namely, surface roughness in maximum height) (Rmax) was 0.96 nm and thus Rmax/RMS was 9.6. Accordingly, variation in surface roughness was satisfactorily small.

Then, the surface of the CrN underlayer was again subjected to a defect inspection using a mask blank defect inspection apparatus (MAGICS M1350: manufactured by Lasertec Corporation) (inspection region: 142 mm×142 mm). As a result, the number of defects having a size of 60 nm was zero, which was satisfactory. Further, the surface of the CrN underlayer was subjected to a defect inspection using a mask/mask blank defect inspection apparatus (Teron 600: manufactured by KLA-Tencor Corporation) (inspection region: 132 mm×132 mm). As a result, the number of detected defects was 27,902, which was significantly reduced as compared with a detected defect number of more than 100,000 of later-described Reference Example. With the detected defect number on this level, it is possible to detect the presence or absence of foreign matter or a critical defect such as a crack.

Thereafter, fiducial marks, a multilayer reflective film, a capping layer, an absorber layer, and a conductive film were formed in the same manner as in Example 2, thereby obtaining an EUV reflective mask blank.

The contrast of the fiducial marks and variation in defect detection position were evaluated in the same manner as in Example 2. As a result, the same results as those in Example 2 were obtained. Further, a surface of the multilayer reflective film and a surface of the EUV reflective mask blank were subjected to a defect inspection using a mask blank defect inspection apparatus (MAGICS M1350: manufactured by Lasertec Corporation) (inspection region: 142 mm×142 mm) and a mask/mask blank defect inspection apparatus (Teron 600: manufactured by KLA-Tencor Corporation) (inspection region: 132 mm×132 mm). As a result, the number of defects and the number of detected defects were several and about 37,000, respectively. The number of detected defects was significantly reduced as compared with a detected defect number of more than 100,000 of later-described Reference Example. With the detected defect number on this level, it is possible to detect the presence or absence of foreign matter or a critical defect such as a crack.

In Example 3, this invention has been described by citing the example in which the glass substrate with the underlayer was judged to be unsuccessful in the defect inspection of the surface of the underlayer. But, this invention is not limited thereto. It is needless to say that this invention is also applicable to recycling of the glass substrate when the specification of the fiducial marks was not satisfied in the fiducial mark forming process.

Example 4

In Example 1, a laminated underlayer comprising a CrN layer (Cr: 90 at %, N: 10 at %) having an amorphous crystal structure and a Si layer was used instead of the Si underlayer. Specifically, first, using a Cr target and using a mixed gas of Ar, He, and $N_2$ as a sputtering gas, DC magnetron sputtering was carried out to form a CrN layer having a thickness of 5 nm. Subsequently, using a B-doped Si target and using a mixed gas of Ar and He as a sputtering gas, DC magnetron sputtering was carried out to form a Si layer having a thickness of 100 nm. In this manner, a laminated underlayer of the CrN layer and the Si layer was formed.

Since the film stress of the CrN layer should be as small as possible and should prevent an increase in surface roughness of the Si layer formed as its upper layer, the crystal structure of the CrN layer is preferably amorphous and its thickness is preferably as small as possible. On the other hand, in order to achieve a function of an etching stopper that prevents damage to the glass substrate when fiducial marks are formed on the upper Si layer by fluorine-based dry etching, a certain thickness is required. From this point of view, the thickness of the CrN layer is set to 2 nm to 20 nm, preferably 3 nm to 15 nm.

A surface of the laminated underlayer of the CrN layer and the Si layer was precision-polished in the same manner as in Example 1. As a result, in a 142 mm×142 mm measurement region, the flatness was 85 nm and thus satisfied the target value of 100 nm or less. Further, in a 1 μm×1 μm measurement region, the surface roughness was 0.08 nm in RMS and thus was excellent.

Since the surface of the laminated underlayer has an extremely high smoothness of 0.08 nm or less in RMS, background noise in a highly sensitive defect inspection apparatus is reduced, which is effective in terms of suppressing false defect detection.

Further, in a 1 μm×1 μm measurement region, the maximum surface roughness (namely, surface roughness in maximum height) (Rmax) was 0.50 nm and thus Rmax/RMS was 6.25. Accordingly, variation in surface roughness was satisfactorily small.

Then, the surface of the laminated underlayer of the CrN layer and the Si layer was subjected to a defect inspection using a mask blank defect inspection apparatus (MAGICS M1350: manufactured by Lasertec Corporation) (inspection region: 142 mm×142 mm). As a result, the number of defects having a size of 60 nm was zero, which was satisfactory. Further, the surface of the laminated underlayer was subjected to a defect inspection using a mask/mask blank defect inspection apparatus (Teron 600: manufactured by KLA-Tencor Corporation) (inspection region: 132 mm×132 mm). As a result, the number of detected defects was 15,013, which was significantly reduced as compared with a detected defect number of more than 100,000 of later-described Reference Example. With the detected defect number on this level, it is possible to detect the presence or absence of foreign matter or a critical defect such as a crack.

Reference marks were formed on the laminated underlayer of the CrN layer and the Si layer in the same manner as in Example 1 except that the fiducial marks (depth: 100 nm) were formed on the upper Si layer by dry etching with a fluorine-based gas using a resist pattern as a mask, thereby manufacturing an EUV mask blank glass substrate formed with the fiducial marks.

The cross-sectional shape of each fiducial mark was observed by AFM. As a result, the cross-section was substantially upright, which was satisfactory.

In the same manner as in Example 1, a multilayer reflective film was formed on the laminated underlayer of the CrN layer and the Si layer to manufacture a multilayer reflective film coated substrate and then a RuNb capping layer, an absorber layer in the form of a laminate of a TaBN film and a TaBO film, and a conductive film were formed, thereby obtaining an EUV reflective mask blank.

In the state of the multilayer reflective film coated substrate, the reflectance of a surface of the multilayer reflective film was evaluated by an EUV reflectometer. As a result, like in Example 1, since variation in surface roughness of the underlayer was suppressed, the reflectance was 67%±0.15%, which was satisfactory.

The contrast of the fiducial marks and variation in defect detection position were evaluated in the same manner as in Example 1. As a result, with respect to each of the fiducial marks reflected and formed on the surface of the multilayer reflective film, the contrast for inspection light was 0.50 and variation in defect detection position was 90 nm using the mask/mask blank defect inspection apparatus, which was satisfactory. Further, the surface of the multilayer reflective film and a surface of the EUV reflective mask blank were subjected to a defect inspection using a mask blank defect inspection apparatus (MAGICS M1350: manufactured by Lasertec Corporation) (inspection region: 142 mm×142 mm) and a mask/mask blank defect inspection apparatus (Teron 600: manufactured by KLA-Tencor Corporation) (inspection region: 132 mm×132 mm). As a result, the number of defects and the number of detected defects were several and about 16,000, respectively. The number of detected defects was significantly reduced as compared with a detected defect number of more than 100,000 of later-described Reference Example. With the detected defect number on this level, it is possible to detect the presence or absence of foreign matter or a critical defect such as a crack.

Further, an EUV reflective mask was manufactured using the EUV reflective mask blank. Like in Example 1, the EUV reflective mask blank and the EUV reflective mask were also satisfactorily manufactured.

Example 5

A synthetic quartz substrate (size: about 152.4 mm×about 152.4 mm, thickness: about 6.35 mm) was prepared. Specifically, using a double-side polishing machine, both front and back surfaces of the glass substrate were polished stepwise with cerium oxide abrasive particles and colloidal silica abrasive particles and then treated with low-concentration fluorosilicic acid. The surface roughness of the prepared glass substrate was 0.2 nm in RMS. The flatness of the front and back surfaces of the glass substrate was about 290 nm.

Thereafter, the surface machining process was carried out in the same manner as in Example 1.

Then, using a Si target and using a mixed gas of Ar, $O_2$, and $N_2$ as a sputtering gas, DC magnetron sputtering was carried out to form a SiON underlayer having a thickness of 100 nm on the obtained glass substrate. The composition of the SiON underlayer was Si: 40 at %, O: 27 at %, and N: 33 at %.

A surface of the SiON underlayer was precision-polished in the same manner as in Example 1. As a result, in a 142 mm×142 mm measurement region, the flatness was 85 nm and thus satisfied the target value of 100 nm or less. Further, in a 1 μm×1 μm measurement region, the surface roughness was 0.10 nm in RMS and thus was satisfactory.

Since the surface of the CrN underlayer has an extremely high smoothness of 0.1 nm or less in RMS, background noise in a highly sensitive defect inspection apparatus is reduced, which is effective in terms of suppressing false defect detection.

Further, in a 1 μm×1 μm measurement region, the maximum surface roughness (namely, surface roughness in maximum height) (Rmax) was 1.00 nm and thus Rmax/RMS was 10. Accordingly, variation in surface roughness was satisfactorily small.

Then, the surface of the SiON underlayer was subjected to a defect inspection using a mask blank defect inspection apparatus (MAGICS M1350: manufactured by Lasertec Corporation) (inspection region: 142 mm×142 mm). As a result, the number of defects having a size of 60 nm was zero, which was satisfactory. Further, the surface of the SiON underlayer was subjected to a defect inspection using a mask/mask blank defect inspection apparatus (Teron 600: manufactured by KLA-Tencor Corporation) (inspection region: 132 mm×132 mm). As a result, the number of detected defects was 29,563, which was significantly reduced as compared with a detected defect number of more than 100,000 of later-described Reference Example. With the detected defect number on this level, it is possible to detect the presence or absence of foreign matter or a critical defect such as a crack.

Reference marks were formed on the SiON underlayer in the same manner as in Example 1, thereby manufacturing a binary mask blank glass substrate formed with the fiducial marks.

The cross-sectional shape of each fiducial mark was observed by AFM. As a result, the cross-section was substantially upright, which was satisfactory.

Then, on the SiON underlayer, a light-shielding film in the form of a laminate of a TaN film and a TaO film was formed in the following manner.

Specifically, first, using a tantalum (Ta) target, reactive sputtering (DC sputtering) was carried out by setting the power of a DC power supply to 1.5 kW in a mixed gas atmosphere of xenon (Xe) and nitrogen ($N_2$) (gas pressure 0.076 Pa, gas flow rate ratio Xe:$N_2$=11 sccm:15 sccm), thereby forming a TaN film having a thickness of 44.9 nm. Subsequently, using a Ta target, reactive sputtering (DC sputtering) was carried out by setting the power of a DC power supply to 0.7 kW in a mixed gas atmosphere of argon (Ar) and oxygen ($O_2$) (gas pressure 0.3 Pa, gas flow rate ratio Ar:$O_2$=58 sccm:32.5 sccm), thereby forming a TaO film having a thickness of 13 nm. In this manner, a light-shielding film for ArF excimer laser light (wavelength: 193 nm) in the form of the laminate of the TaN film and the TaO film was formed on the SiON underlayer, thereby manufacturing a binary mask blank. The light-shielding film had an optical density of 3.0 for ArF excimer laser light and had a front-surface reflectance of 19.5%.

Then, the obtained binary mask blank was subjected to a defect inspection using a mask blank defect inspection apparatus (MAGICS M1350: manufactured by Lasertec Corporation) (inspection region: 142 mm×142 mm). Concave and convex defect position information using the fiducial marks formed on the underlayer as references and defect size information were obtained. As a consequence, defect information in which the binary mask blank and these defect position information and defect size information were correlated with each other was obtained. The contrast of the fiducial mark and variation in defect detection position were evaluated in the same manner as in Example 1. As a result, with respect to each of the fiducial marks reflected and formed on a surface of the light-shielding film or the binary mask blank, the contrast for inspection light was 0.55 and variation in defect detection position was 92 nm using the mask/mask blank defect inspection apparatus, which was satisfactory. Further, the surface of the binary mask blank was subjected to a defect inspection using a mask blank defect inspection apparatus (MAGICS M1350: manufactured by Lasertec Corporation) (inspection region: 142 mm×142 mm) and a mask/mask blank defect inspection apparatus (Teron 600: manufactured by KLA-Tencor Corporation) (inspection region: 132 mm×132 mm). As a result, the number of defects and the number of detected defects were several and about 40,000, respectively. The number of detected defects was significantly reduced as compared with a detected defect number of more than 100,000 of later-described Reference Example. With the detected defect number on this level, it is possible to detect the presence or absence of foreign matter or a critical defect such as a crack.

Then, using the binary mask blank with the above-mentioned defect information, a binary mask was manufactured.

First, a resist for electron-beam writing was spin-coated on the binary mask blank and then baked, thereby forming a resist film.

Then, like in Example 1, based on the defect information of the binary mask blank and further based on mask pattern data designed in advance, a selection was made among correction to mask pattern data having no influence on pattern transfer using an exposure apparatus, correction to mask pattern data added with correction pattern data when judged to have an influence on the pattern transfer, and correction to mask pattern data capable of reducing the load of defect correction after the manufacture of a mask in the case of a defect not curable by correction pattern data. Based on the corrected mask pattern data, a mask pattern was written on the resist film by an electron beam and then development was carried out, thereby forming a resist pattern.

Using the resist pattern as a mask, the TaO film was etched with a fluorine-based gas ($CF_4$ gas) while the TaN film was etched with a chlorine-based gas ($Cl_2$ gas), thereby forming a light-shielding film pattern.

Then, the resist pattern remaining on the light-shielding film pattern was removed by hot sulfuric acid, thereby obtaining a binary mask.

Example 6

In Example 1, a TaBN underlayer (Ta: 80 at %, B: 10 at %, N: 10 at %) was used instead of the Si underlayer. Specifically, using a TaB target and using a mixed gas of Ar and $N_2$ as a sputtering gas, DC magnetron sputtering was carried out to form a TaBN underlayer having a thickness of 150 nm.

A surface of the TaBN underlayer was precision-polished in the same manner as in Example 1. As a result, in a 142 mm×142 mm measurement region, the flatness was 85 nm and thus satisfied the target value of 100 nm or less. Further, in a 1 μm×1 μm measurement region, the surface roughness was 0.085 nm in RMS and thus was excellent.

Since the surface of the TaBN underlayer has an extremely high smoothness of 0.1 nm or less in RMS, background noise in a highly sensitive defect inspection apparatus is reduced, which is effective in terms of suppressing false defect detection.

Further, in a 1 μm×1 μm measurement region, the maximum surface roughness (namely, surface roughness in maximum height) (Rmax) was 0.8 nm and thus Rmax/RMS was 9.4. Accordingly, variation in surface roughness was satisfactorily small.

Then, the surface of the TaBN underlayer was subjected to a defect inspection using a mask blank defect inspection apparatus (MAGICS M1350: manufactured by Lasertec Corporation) (inspection region: 142 mm×142 mm). As a result, the number of defects having a size of 60 nm was zero, which was satisfactory. Further, the surface of the TaBN underlayer was subjected to a defect inspection using a mask/mask blank defect inspection apparatus (Teron 600: manufactured by KLA-Tencor Corporation) (inspection region: 132 mm×132 mm). As a result, the number of detected defects was 19,337, which was significantly reduced as compared with a detected defect number of more than 100,000 of later-described Reference Example. With the detected defect number on this level, it is possible to detect the presence or absence of foreign matter or a critical defect such as a crack.

Reference marks were formed on the TaBN underlayer in the same manner as in Example 1 except that FIB (focused ion beam) was used, thereby manufacturing an EUV mask blank glass substrate formed with the fiducial marks.

The cross-sectional shape of each fiducial mark was observed by AFM. As a result, the cross-section was substantially upright, which was satisfactory.

In the same manner as in Example 1, a multilayer reflective film was formed on the TaBN underlayer to manufacture a multilayer reflective film coated substrate and then a RuNb capping layer, an absorber layer in the form of a laminate of a TaBN film and a TaBO film, and a conductive film were formed, thereby obtaining an EUV reflective mask blank.

In the state of the multilayer reflective film coated substrate, the reflectance of a surface of the multilayer reflective film was evaluated by an EUV reflectometer. As a result, like in Example 1, since variation in surface roughness of the underlayer was suppressed, the reflectance was 67%±0.25%, which was satisfactory.

The contrast of the fiducial marks and variation in defect detection position were evaluated in the same manner as in Example 1. As a result, with respect to each of the fiducial marks reflected and formed on the surface of the multilayer reflective film, the contrast for inspection light was 0.51 and variation in defect detection position was 92 nm using the mask/mask blank defect inspection apparatus, which was satisfactory. Further, the surface of the multilayer reflective film and a surface of the EUV reflective mask blank were subjected to a defect inspection using a mask blank defect inspection apparatus (MAGICS M1350: manufactured by Lasertec Corporation) (inspection region: 142 mm×142 mm) and a mask/mask blank defect inspection apparatus (Teron 600: manufactured by KLA-Tencor Corporation) (inspection region: 132 mm×132 mm). As a result, the number of defects and the number of detected defects were several and about 25,000, respectively. The number of detected defects was significantly reduced as compared with a detected defect number of more than 100,000 of later-described Reference Example. With the detected defect number on this level, it is possible to detect the presence or absence of foreign matter or a critical defect such as a crack.

Further, an EUV reflective mask was manufactured using the EUV reflective mask blank. Like in Example 1, the EUV reflective mask blank and the EUV reflective mask were also satisfactorily manufactured.

Example 7

In Example 1, ion-beam sputtering was carried out to form a Si underlayer having a thickness of 100 nm.

A surface of the Si underlayer was precision-polished in the same manner as in Example 1. As a result, in a 142 mm×142 mm measurement region, the flatness was 85 nm and thus satisfied the target value of 100 nm or less. Further, in a 1 μm×1 μm measurement region, the surface roughness was 0.08 nm in RMS and thus was excellent.

Since the surface of the Si underlayer has an extremely high smoothness of 0.08 nm in RMS, background noise in a highly sensitive defect inspection apparatus is reduced, which is effective in terms of suppressing false defect detection.

Further, in a 1 μm×1 μm measurement region, the maximum surface roughness (namely, surface roughness in maximum height) (Rmax) was 0.55 nm and thus Rmax/RMS was 6.88. Accordingly, variation in surface roughness was satisfactorily small. The reason that the surface roughness and variation in surface roughness were better than Example 1 is presumably because since the Si film was formed under higher vacuum by ion-beam sputtering than by DC magnetron sputtering, the film with a higher density was formed.

Then, the surface of the Si underlayer was subjected to a defect inspection using a mask blank defect inspection apparatus (MAGICS M1350: manufactured by Lasertec Corporation) (inspection region: 142 mm×142 mm). As a result, the number of defects having a size of 60 nm was zero, which was satisfactory. Further, the surface of the Si underlayer was subjected to a defect inspection using a mask/mask blank defect inspection apparatus (Teron 600: manufactured by KLA-Tencor Corporation) (inspection region: 132 mm×132 mm). As a result, the number of detected defects was 15,744, which was significantly reduced as compared with a detected defect number of more than 100,000 of later-described Reference Example. With the detected defect number on this level, it is possible to detect the presence or absence of foreign matter or a critical defect such as a crack.

Reference marks were formed on the Si underlayer in the same manner as in Example 1 except that FIB (focused ion beam) was used, thereby manufacturing an EUV mask blank glass substrate formed with the fiducial marks.

The cross-sectional shape of each fiducial mark was observed by AFM. As a result, the cross-section was substantially upright, which was satisfactory.

In the same manner as in Example 1, a multilayer reflective film was formed on the Si underlayer to manufacture a multilayer reflective film coated substrate and then a RuNb capping layer, an absorber layer in the form of a laminate of a TaBN film and a TaBO film, and a conductive film were formed, thereby obtaining an EUV reflective mask blank.

In the state of the multilayer reflective film coated substrate, the reflectance of a surface of the multilayer reflective film was evaluated by an EUV reflectometer. As a result, like in Example 1, since variation in surface roughness of the underlayer was suppressed, the reflectance was 67%±0.2%, which was satisfactory.

The contrast of the fiducial marks and variation in defect detection position were evaluated in the same manner as in Example 1. As a result, with respect to each of the fiducial marks reflected and formed on the surface of the multilayer reflective film, the contrast for inspection light was 0.51 and variation in defect detection position was 90 nm using the mask/mask blank defect inspection apparatus, which was satisfactory. Further, the surface of the multilayer reflective film and a surface of the EUV reflective mask blank were subjected to a defect inspection using a mask blank defect inspection apparatus (MAGICS M1350: manufactured by Lasertec Corporation) (inspection region: 142 mm×142 mm) and a mask/mask blank defect inspection apparatus (Teron 600: manufactured by KLA-Tencor Corporation) (inspection region: 132 mm×132 mm). As a result, the number of defects and the number of detected defects were several and about 16,000, respectively. The number of detected defects was significantly reduced as compared with a detected defect number of more than 100,000 of later-described Reference Example. With the detected defect number on this level, it is possible to detect the presence or absence of foreign matter or a critical defect such as a crack.

Further, an EUV reflective mask was manufactured using the EUV reflective mask blank. Like in Example 1, the EUV reflective mask blank and the EUV reflective mask were also satisfactorily manufactured.

Reference Example

There was prepared a $SiO_2$—$TiO_2$-based glass substrate (size: about 152.4 mm×about 152.4 mm, thickness: about 6.35 mm) having been subjected to the surface machining process in the same manner as in Example 1. In a 1 μm×1 μm measurement region, the surface roughness of the prepared glass substrate was 0.15 nm in RMS and 1.78 nm in Rmax. The flatness of front and back surfaces of the glass substrate was about 290 nm.

Then, on the main surface (front surface) of the glass substrate, a thin film for mark formation made of CrOCN (Cr:O:C:N=33:36:20:11 in at % ratio) was formed to a thickness of 10 nm by sputtering.

A resist for electron-beam writing was spin-coated on the mark-formation thin film and then baked, thereby forming a resist film having a thickness of 300 nm. Reference marks were written on predetermined portions of the resist film using an electron-beam writing apparatus and then development was carried out, thereby forming a resist pattern. Using the resist pattern as a mask, the mark-formation thin film was dry-etched with a mixed gas of chlorine and oxygen, thereby transferring patterns of the fiducial marks to the mark-formation thin film to obtain a mask-formation thin film pattern. Further, using this mark-formation thin film pattern as a mask, the glass substrate was dry-etched with a mixed gas of fluorine-based gas ($CF_4$ gas) and He gas. The remaining mark-formation thin film pattern was removed by etching with a mixed gas of chlorine and oxygen. In this manner, the fiducial marks were formed directly on the main surface of the glass substrate. The surface roughness of the obtained glass substrate was measured.

As a result, in a 1 μm×1 μm measurement region, the surface roughness was 0.16 nm in RMS and 1.95 nm in Rmax. In this Reference Example, because of being the $SiO_2$—$TiO_2$-based glass substrate, it was difficult to achieve a high smoothness of 0.1 nm or less in RMS. There is a possibility that background noise due to the surface roughness occurs to increase false defect detection in a highly sensitive defect inspection. In fact, as a result of carrying out a defect inspection of a surface of the CrOCN mark-formation thin film in the same manner as in Example 1 using a mask/mask blank defect inspection apparatus (Teron 600: manufactured by KLA-Tencor Corporation) (inspection region: 132 mm×132 mm), the number of detected defects exceeded 100,000 so that it was not possible to inspect the presence or absence of foreign matter or a critical defect such as a crack. Further, since the fiducial marks are formed directly on the glass substrate, it is difficult to recycle the glass substrate after the formation of the fiducial marks.

Further, Rmax/RMS was 12.2 and thus was a large value as compared with those of the Examples described above. A multilayer reflective film was formed on the main surface of the glass substrate in the same manner as in Example 1 and then the reflectance of a surface of the multilayer reflective film was evaluated by an EUV reflectometer. As a result, the reflectance was 66%±0.35%, which was worse as compared with the Examples described above.

The contrast of the fiducial marks and variation in defect detection position were evaluated in the same manner as in Example 1. As a result, with respect to each of the fiducial marks reflected and formed on the surface of the multilayer reflective film, the contrast for inspection light was 0.48 and variation in defect detection position was 92 nm using the mask/mask blank defect inspection apparatus, which was substantially the same as in Example 1. Further, the surface of the multilayer reflective film and a surface of an EUV reflective mask blank were subjected to a defect inspection using a mask/mask blank defect inspection apparatus (Teron 600: manufactured by KLA-Tencor Corporation) (inspection region: 132 mm×132 mm). As a result, the number of detected defects exceeded 100,000 so that it was not possible to inspect the presence or absence of foreign matter or a critical defect such as a crack.

In the above-mentioned Examples, the fiducial marks were formed by the photolithography. However, this invention is not limited thereto. As described before, when the cross-sectional shape of a fiducial mark is concave, the fiducial mark can be formed by recess formation by laser light or an ion beam, machining trace by scanning a diamond stylus, indention by a micro-indenter, stamping by an imprint method, or the like. When the cross-sectional shape of a fiducial mark is convex, the fiducial mark can be formed by partial film formation by FIB, sputtering, or the like. In addition, although the above description has been made only about a glass substrate, the substrate may not always be restricted to the glass substrate.

What is claimed is:

1. A mask blank glass substrate, comprising:
   a glass substrate having a main surface on which a transfer pattern is to be formed;
   an underlayer that is formed on the main surface to reduce a surface roughness of the main surface of the glass substrate or to reduce defects of the main surface of the glass substrate and that has a precision-polished surface; and
   a fiducial mark formed for the underlayer to provide a reference for a defect position in defect information,
   wherein the fiducial mark is formed inside the underlayer but is not formed inside the glass substrate.

2. The mask blank glass substrate according to claim 1, wherein the underlayer is made of Si or a silicon compound containing Si.

3. The mask blank glass substrate according to claim 1, wherein the underlayer is made of a material that is etchable by the use of a chlorine-based gas.

4. The mask blank glass substrate according to claim 3, wherein the underlayer is made of Al, Ta, Zr, Ti, Cr, or a material containing at least one of them.

5. The mask blank glass substrate according to claim 1, wherein the glass substrate is made of a $SiO_2$—$TiO_2$-based glass or a multicomponent glass-ceramic.

6. A multilayer reflective film coated substrate, wherein a multilayer reflective film adapted to reflect EUV light is formed on the underlayer of the mask blank glass substrate according to claim 1.

7. A mask blank, wherein a thin film to be a transfer pattern is formed on the multilayer reflective film of the multilayer reflective film coated substrate according to claim 6.

8. A mask, wherein the thin film of the mask blank according to claim 7 is patterned.

9. A mask blank, wherein a thin film to be a transfer pattern is formed on the underlayer of the mask blank glass substrate according to claim 1.

10. A mask, wherein the thin film of the mask blank according to claim 9 is patterned.

11. A mask blank substrate comprising:
a substrate that has a main surface with a main surface roughness;
an underlayer that is contacted with the main surface and that has an underlayer surface roughness smaller than the main surface roughness; and
a fiducial mark located for the underlayer to provide a reference for a defect position in defect information,
wherein the fiducial mark is formed inside the underlayer but is not formed inside the substrate.

12. A multilayer reflective film coated substrate, wherein a multilayer reflective film that reflects EUV light and that is contacted with the surface of the underlayer of the mask blank substrate according to claim 11.

13. A mask blank comprising a thin film for forming a transfer pattern, that is located on the underlayer of the mask blank substrate according to claim 11.

14. A mask comprising a transfer pattern that is located on the underlayer of the mask blank substrate according to claim 11.

15. A mask blank comprising a thin film for forming a transfer pattern, that is located on the multilayer reflective film of the multilayer reflective film coated substrate according to claim 12.

16. A mask comprising a transfer pattern that is located on the multilayer reflective film of the multilayer reflective film coated substrate according to claim 12.

* * * * *